(12) United States Patent
Wu

(10) Patent No.: US 10,451,662 B2
(45) Date of Patent: Oct. 22, 2019

(54) CAPACITIVE PRESSURE SENSING CIRCUIT AND CAPACITANCE-TO-VOLTAGE CONVERTER THEREOF

(71) Applicant: PIXART IMAGING INC., Hsin-Chu (TW)

(72) Inventor: Sung-Han Wu, Hsin-Chu (TW)

(73) Assignee: PIXART IMAGING INC., Hsin-Chu (TW)

(*) Notice: Subject to any disclaimer, the term of this patent is extended or adjusted under 35 U.S.C. 154(b) by 222 days.

(21) Appl. No.: 15/663,161

(22) Filed: Jul. 28, 2017

(65) Prior Publication Data
US 2018/0074101 A1 Mar. 15, 2018

(30) Foreign Application Priority Data
Sep. 9, 2016 (TW) .............................. 105129310 A

(51) Int. Cl.
| | |
|---|---|
| *G01R 27/26* | (2006.01) |
| *G06F 3/044* | (2006.01) |
| *G06F 3/045* | (2006.01) |
| *G06F 3/041* | (2006.01) |
| *H03K 17/96* | (2006.01) |

(52) U.S. Cl.
CPC ......... *G01R 27/2605* (2013.01); *G06F 3/044* (2013.01); *G06F 3/045* (2013.01); *G06F 3/0416* (2013.01); *H03K 17/962* (2013.01)

(58) Field of Classification Search
CPC .. G01R 27/2605; G01R 15/16; G01R 31/028; G01R 19/0084; G01R 27/02; G01R 27/26; G01R 29/12

USPC .......... 324/76.11–76.83, 459, 600, 649, 658
See application file for complete search history.

(56) References Cited

U.S. PATENT DOCUMENTS

| | | | |
|---|---|---|---|
| 2003/0185028 A1 | 10/2003 | Horimoto | |
| 2007/0188973 A1* | 8/2007 | Kawai | H03H 11/481 361/272 |
| 2008/0173105 A1 | 7/2008 | Wang et al. | |
| 2011/0227607 A1* | 9/2011 | Kim | H03F 1/34 327/51 |
| 2014/0196546 A1 | 7/2014 | Topmiller | |
| 2017/0126045 A1* | 5/2017 | Chen | H02J 7/0057 |

FOREIGN PATENT DOCUMENTS

| | | |
|---|---|---|
| CN | 1449099 A | 10/2003 |
| CN | 102892354 A | 1/2013 |
| CN | 105222931 A | 1/2016 |

(Continued)

*Primary Examiner* — Giovanni Astacio-Oquendo
*Assistant Examiner* — Raul J Rios Russo
(74) *Attorney, Agent, or Firm* — Li & Cai Intellectual Property (USA) Office

(57) ABSTRACT

Disclosed is a capacitive pressure sensing circuit and a capacitance-to-voltage converter thereof. The pressure sensing circuit comprises a converter, a cancellation circuit and a signal processor. The cancellation circuit is connected between the converter and at least one capacitive pressure sensor. The cancellation circuit attenuates the inductive capacitance generated by the capacitive pressure sensor to prevent an overflow happening when the inductive capacitance received by the converter is too large, such that the converter can effectively output a voltage signal corresponding to the attenuated inductive capacitance.

31 Claims, 14 Drawing Sheets

(56) References Cited

FOREIGN PATENT DOCUMENTS

| | | | |
|---|---|---|---|
| TW | 201349064 | A | 12/2013 |
| TW | 201508598 | A | 3/2015 |
| TW | 201621289 | A | 6/2016 |

\* cited by examiner

CAPACITIVE PRESSURE SENSING CIRCUIT AND CAPACITANCE-TO-VOLTAGE CONVERTER THEREOF

BACKGROUND OF THE INVENTION

1. Field of the Invention

The instant disclosure relates to a pressure sensing circuit; in particular, to a capacitive pressure sensing circuit and a capacitance-to-voltage converter thereof.

2. Description of Related Art

Generally speaking, common touch sensors are either resistive or capacitive. The capacitive touch sensor costs less and has a higher signal-noise ratio (SNR). Thus, the capacitive touch sensor has been mainly used in most touch systems. Briefly, the working principle of the capacitive touch sensor is to determine whether a touch event happens according to the variation of the inductive capacitance generated when an external conductor, such as a finger, is approaching or leaving the sensing electrodes.

However, when the above mentioned capacitive touch sensor needs to detect a pressure applied by a user after he is just touching a touch sensing panel, there may be an overflow because the inductive capacitance generated when the user applies a pressure to the touch sensing panel is much larger than the inductive capacitance generated when the user is just touching the touch sensing panel. Due to the overflow, a capacitance-to-voltage converter cannot correctly convert the inductive capacitance to a corresponding voltage value.

SUMMARY OF THE INVENTION

The instant disclosure provides a capacitive pressure sensing circuit. The pressure sensing circuit comprises a converter, a cancellation circuit, an analog-to-digital converter and a digital signal processor. The converter is connected to a pin. The converter receives a sensing signal provided by the pin, and thereby outputs an analog voltage signal. The cancellation circuit is connected between the converter and the pin. The cancellation circuit generates a cancellation signal, such that the converter outputs the analog voltage signal according to the sensing signal and the cancellation signal. The analog-to-digital converter is connected to the converter and converts the analog voltage signal to a digital voltage signal. The digital signal processor is connected to the analog-to-digital converter and generates a sensed pressure related to the sensing signal according to the digital voltage signal.

The instant disclosure provides another capacitive pressure sensing circuit. The pressure sensing circuit comprises a converter, an analog-to-digital converter, a cancellation circuit and a digital signal processor. The converter is connected to a pin. The converter receives a sensing signal provided by the pin, and thereby outputs an analog voltage signal. The analog-to-digital converter is connected to the converter, and converts the analog voltage signal to a digital voltage signal. The cancellation circuit is connected between the converter and the analog-to-digital converter. The cancellation circuit generates a cancellation signal, such that the analog-to-digital converter outputs the digital voltage signal according to the analog voltage signal from which the cancellation signal is subtracted. The digital signal processor is connected to the analog-to-digital converter, and generates a sensed pressure related to the sensing signal according to the digital voltage signal.

Preferably, in the pressure sensing circuit of one embodiment provided by the instant disclosure, an inductive capacitance generated by at least one capacitive pressure sensor is represented by the sensing signal. The pin is configured to make the pressure sensing circuit connect to an output end of the capacitive pressure sensor.

The instant disclosure provides still another capacitive pressure sensing circuit. The pressure sensing circuit comprises a converter, a suppression circuit, an analog-to-digital converter and a digital signal processor. The converter is connected to a pin, receives a sensing signal provided by the pin and thereby outputs an analog voltage signal. The suppression circuit is connected between the converter and the pin. The suppression circuit suppresses the sensing signal according to a predetermined parameter and provides the suppressed sensing signal to the converter, such that the converter outputs the analog voltage signal according to the suppressed sensing signal. The analog-to-digital converter is connected to the converter and converts the analog voltage signal to a digital voltage signal. The digital signal processor is connected to the analog-to-digital converter, and generates a sensed pressure related to the sensing signal according to the digital voltage signal.

Preferably, in the pressure sensing circuit of one embodiment provided by the instant disclosure, an inductive capacitance generated by at least one capacitive pressure sensor is represented by the sensing signal. The pin is configured to make the pressure sensing circuit connect to an output end of the capacitive pressure sensor.

The instant disclosure provides a capacitance-to-voltage converter used to prevent an overflow that happens when the capacitance of an input capacitor is too large. The capacitance-to-voltage converter comprises an operation amplifier, a negative feedback circuit and an impedance component. The operation amplifier has an inverting input end connected to the input capacitor, has a non-inverting input end connected to a reference voltage, and has an output end to output an analog voltage signal according to the input capacitor. The negative feedback circuit is connected between the inverting input end and the output end of the operation amplifier. The negative feedback circuit is composed of a capacitor and a resistor connected in parallel. The impedance component is connected between the inverting input end of the operation amplifier and the input capacitor. The impedance component suppresses the capacitance of the input capacitor according to a predetermined parameter, such that the output end of the operation amplifier outputs the analog voltage signal according to the suppressed capacitance of the input capacitor.

The instant disclosure provides another capacitance-to-voltage converter used to prevent an overflow when the capacitance of an input capacitor is too large. The capacitance-to-voltage converter comprises an operation amplifier, a negative feedback circuit, a second resistor and a third resistor. The operation amplifier, has an inverting input end connected to the input capacitor, has a non-inverting input end connected to a reference voltage and has an output end outputting an analog voltage signal according to the capacitance of the input capacitor. The negative feedback circuit is connected between the inverting input end and the output end of the operation amplifier. The negative feedback circuit is composed of a capacitor and a first resistor connected in parallel. The second resistor is connected between the inverting input end of the operation amplifier and the input capacitor. The third resistor has a first end connected to a node between the second resistor and the input capacitor, and has a second end connected to the reference voltage.

The instant disclosure provides another capacitance-to-voltage converter used to prevent an overflow that happens when the capacitance of an input capacitor is too large. The capacitance-to-voltage converter comprises a first operation amplifier, a negative feedback circuit, a second resistor, a second operation amplifier and a third resistor. The first operation amplifier has an inverting input end connected to the input capacitor, has a non-inverting input end connected to a grounding voltage and has an output end to output an analog voltage signal according to the capacitance of the input capacitor. The negative feedback circuit is connected between the inverting input end and the output end of the first operation amplifier. The negative feedback circuit is composed of a capacitor and a first resistor connected in parallel. The second resistor is connected between the inverting input end of the first operation amplifier and the input capacitor. The second operation amplifier has a non-inverting input end connected to the grounding voltage, and has an inverting input end connected to an output end of the second operation amplifier. The third resistor has a first end connected to a node between the input capacitor and the second resistor, and has a second end connected to the output end of the second operation amplifier.

The instant disclosure provides still another capacitive pressure sensing circuit. The pressure sensing circuit comprises a converter and a cancellation circuit. The converter is connected to a pin, receives a capacitance sensing signal provided by the pin, and thereby outputs a circuit signal related to a pressure sensed by the capacitance sensing signal. The cancellation circuit is connected between the converter and the pin and generating a cancellation signal, such that the converter outputs the circuit signal according to the capacitance sensing signal and the cancellation signal.

Preferably, in the pressure sensing circuit of one embodiment provided by the instant disclosure, the circuit signal is a voltage signal, and the voltage of the voltage signal is positively proportional to the pressure sensed by the capacitance sensing signal.

Preferably, in the pressure sensing circuit of one embodiment provided by the instant disclosure, the voltage signal is an analog voltage signal and the converter is further connected to an analog-to-digital converter. The analog-to-digital converter is configured to convert the analog voltage signal to a digital voltage signal.

Preferably, in the pressure sensing circuit of one embodiment provided by the instant disclosure, the pressure sensing circuit further comprises a digital signal processor. The digital signal processor is connected to the analog-to-digital converter, and generates a sensed pressure related to the capacitance sensing signal according to the digital voltage signal.

To sum up, the capacitive pressure sensing circuit and the capacitance-to-voltage converter thereof have no complex circuits. Instead, the circuit configuration of the pressure sensing circuit and the capacitance-to-voltage converter thereof is quite simple. By using the pressure sensing circuit and the capacitance-to-voltage converter provided by the instant disclosure, the inductive capacitance generated by the capacitive pressure sensor can be attenuated. Thereby, the capacitance-to-voltage converter will not receive a too large inductive capacitance and thus an overflow can be avoided, and also the capacitance-to-voltage converter can effectively output an analog voltage signal corresponding to the attenuated inductive capacitance.

For further understanding of the instant disclosure, reference is made to the following detailed description illustrating the embodiments of the instant disclosure. The description is only for illustrating the instant disclosure, not for limiting the scope of the claim.

BRIEF DESCRIPTION OF THE DRAWINGS

Embodiments are illustrated by way of example and not by way of limitation in the figures of the accompanying drawings, in which like references indicate similar elements and in which.

DETAILED DESCRIPTION OF PREFERRED EMBODIMENTS

The aforementioned illustrations and following detailed descriptions are exemplary for the purpose of further explaining the scope of the instant disclosure. Other objectives and advantages related to the instant disclosure will be illustrated in the subsequent descriptions and appended drawings. In addition, for easy instruction, similar reference numbers or symbols refer to like elements.

Figure 1:
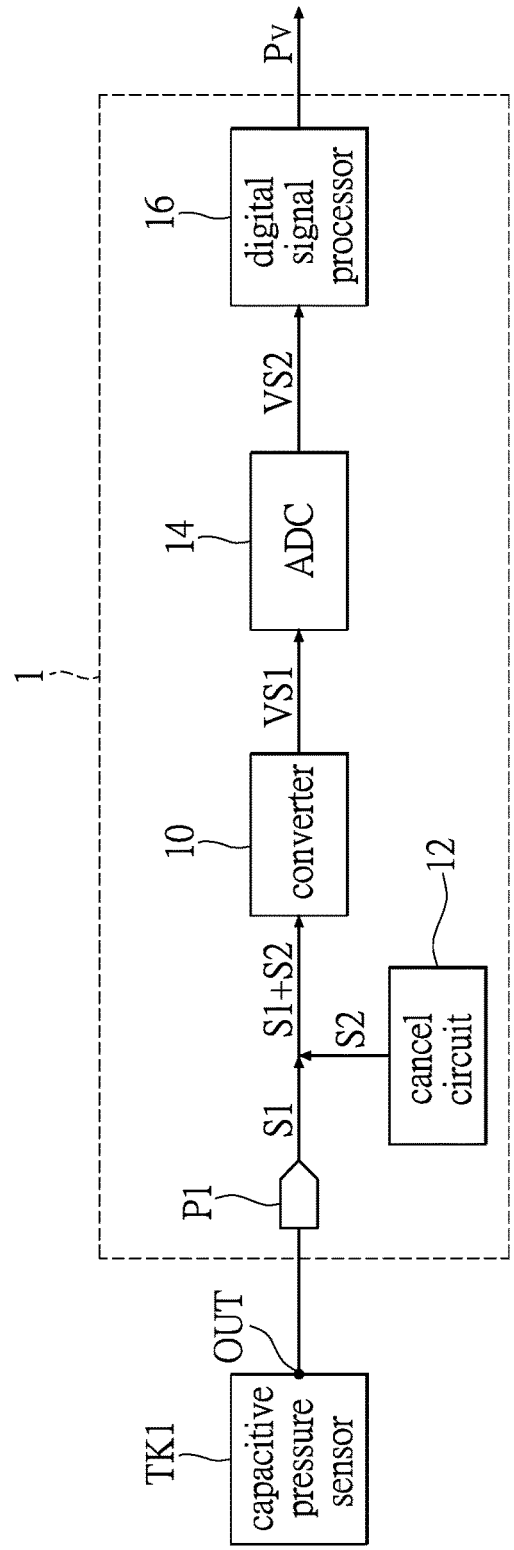
FIG. 1 shows a block diagram of a capacitive pressure sensing circuit of one embodiment of the instant disclosure.

Referring to FIG. 1, FIG. 1 shows a block diagram of a capacitive pressure sensing circuit of one embodiment of the instant disclosure. The pressure sensing circuit 1 comprises a converter 10, a cancellation circuit 12, an analog-to-digital converter 14 and a digital signal processor 16. Each of the above elements can be implemented all by hardware circuits, or by the combination of a hardware circuit and firmware or software, and it is not limited herein. In addition, the above elements can be configured independently or integrated, and it is also not limited herein.

The converter 10 is connected to a pin P1, and receives a sensing signal S1 provided by the pin P1 to thereby output an analog voltage signal VS1. The cancellation circuit 12 is connected between the converter 10 and pin P1, and generates a cancellation signal S2. The converter 10 outputs the analog voltage signal VS1 according to the sensing signal S1 and the cancellation signal S2.

The analog-to-digital converter 14 is connected to the converter 10, and converts the analog voltage signal VS1 to a digital voltage signal VS2. The digital signal processor 16 is connected to the analog-to-digital converter 14, and generates a sensed pressure Pv related to the sensing signal S1 according to the digital voltage signal VS1. It is worth mentioning that, those skilled in the art should be familiar with the working principles of the analog-to-digital converter 14 and the digital signal processor 16, and thus the relevant details are omitted herein.

An inductive capacitance generated by at least one capacitive pressure sensor TK1~TKN is represented by the sensing signal S1. The pin P1 is configured to make the pressure sensing circuit 1 connect to an output end of the capacitive pressure sensor TK1~TKN. The capacitive pressure sensor TK1~TKN can be implemented by a traditional capacitive touch sensor, and thus the relevant details are omitted herein. For the ease of understanding, only one capacitive pressure sensor is used to describe this embodiment (that is, N=1), but it is not limited herein.

Figure 2:
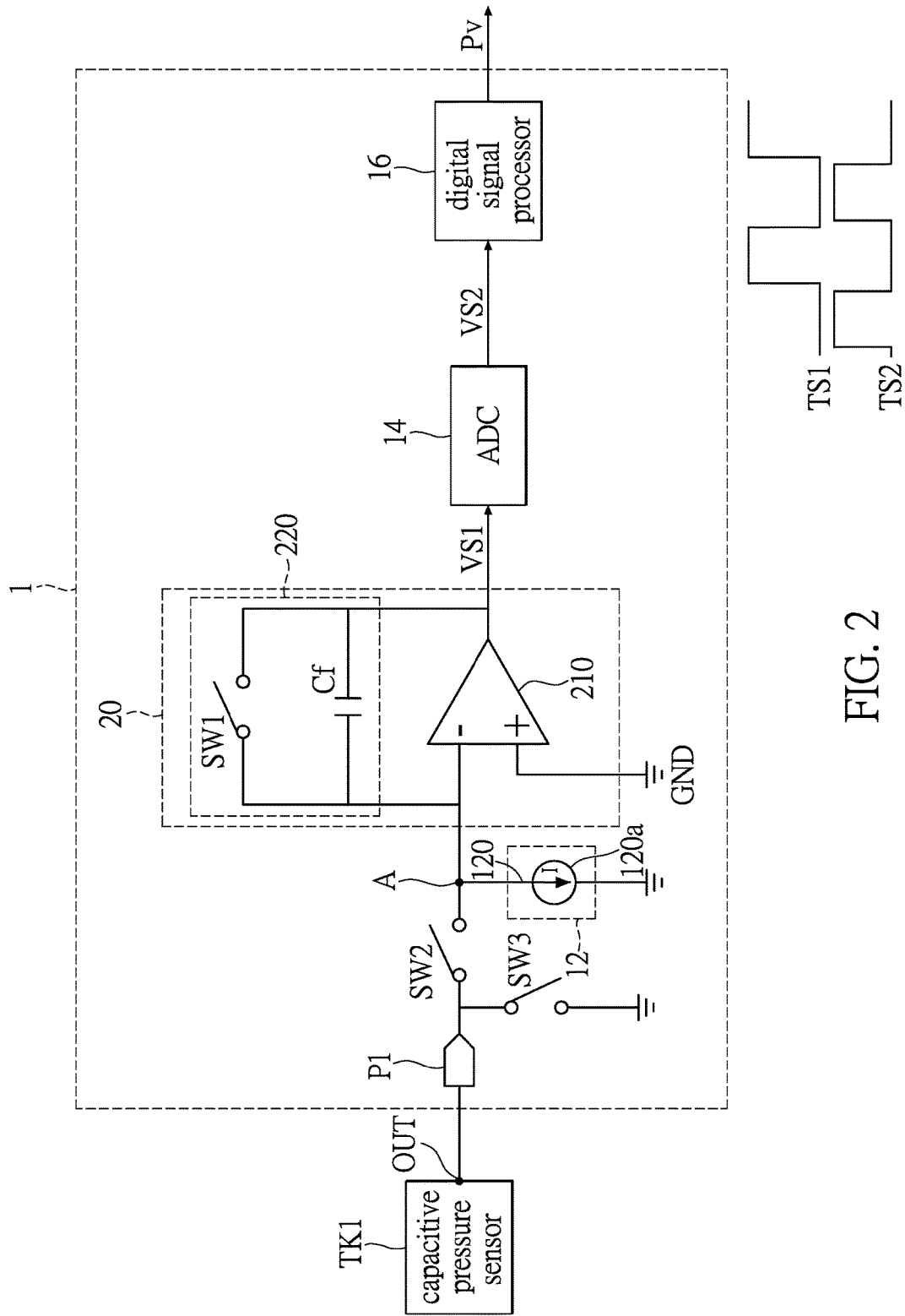
FIG. 2 is a schematic diagram showing the first preferable embodiment of the pressure sensing circuit shown in FIG. 1.

The pressure sensing circuit 1 is further illustrated in the following description with several embodiments. Referring to FIG. 2, FIG. 2 is a schematic diagram showing the first preferable embodiment of a pressure sensing circuit shown in FIG. 1. In addition, for easy instruction, similar reference numbers or symbols refer to like elements in FIG. 2 and FIG. 1.

In the embodiment shown by FIG. 2, the converter 10 can be, for example, a capacitance-to-voltage converter 20. The capacitance-to-voltage converter 20 mainly comprises an operation amplifier 210 and a negative feedback circuit 220. The operation amplifier 210 has an inverting input end connected to a node A between the pin P1 and the cancellation circuit 12, has a non-inverting input end connected to a grounding voltage GND, and has an output end connected to the analog-to-digital converter 14.

In addition, the negative feedback circuit 220 is connected between the inverting input end and the output end of the operation amplifier 210. The negative feedback circuit 220 is composed of a capacitor Cf and a first switch SW1 connected in parallel. The turning on and off of the first switch SW1 is controlled by a first control signal TS1. It is worth mentioning that, those skilled in the art should be familiar with the working principle of the capacitance-to-voltage converter 20, and thus details relevant to the operation amplifier 210 and the negative feedback circuit 220 are omitted herein.

When the inductive capacitance generated by the capacitive pressure sensor TK1 is too large, the capacitance-to-voltage converter 20 is likely to have an overflow due to the large inductive capacitance. As a result, the inductive capacitance cannot be correctly converted to a corresponding voltage. In other words, when the equivalent capacitance Cp (not shown) generated by the capacitive pressure sensor TK1 is too large, the capacitance-to-voltage converter 20 cannot effectively output an analog voltage signal VS1 corresponding to the equivalent capacitance Cp.

One of the main achievements of the instant disclosure is to configure a cancellation circuit 12 between the pin P1 and the capacitance-to-voltage converter 20, such that the inductive capacitance (that is, the sensing signal S1) generated by the capacitive pressure sensor TK1 can be attenuated. Thereby, the capacitance-to-voltage converter 20 will not have an overflow, and the capacitance-to-voltage converter 20 cannot effectively output an analog voltage signal VS1 corresponding to the attenuated inductive capacitance.

It is worth mentioning that, the way to attenuate the inductive capacitance in this embodiment is not restricted herein, and thus it can be designed by those skilled in the art depending on need. Also, it should be noted that, the way to attenuate the inductive capacitance can be to attenuate the inductive capacitance by a constant value or a non-constant value, and it is not limited herein.

In one case, the capacitance-to-voltage converter 20 in FIG. 2 can be considered a design of a discrete circuit. In this case, the pressure sensing circuit 1 in FIG. 2 can further comprise a second switch SW2 and a third switch SW3. The second switch SW2 is connected between the pin P1 and the node A. The turning on and off of the second switch SW2 is controlled by a second control signal TS2. In addition, the third switch SW3 is connected between the pin P1 and the grounding voltage GND. The turning on and off of the third switch SW3 is controlled by the first control signal TS1.

Specifically speaking, the first switch SW1 and the third switch SW3 are turned on by the first control signal TS1 at the same time point. However, the time point when the first switch SW1 and the third switch SW3 are turned on by the first control signal TS1 and the time point when the second switch SW2 is turned on by the second control signal TS2 are different. FIG. 2 has shown the operation timing of the first control signal TS1 and the second control signal TS2, and thus relevant details are omitted herein.

The following description provides an example illustrating how to attenuate the inductive capacitance in this embodiment. Again referring to FIG. 2, the cancellation circuit 12 can be, for example, a branch circuit 120. The branch circuit 120 is connected between the node A and the grounding voltage GND. The branch circuit 120 is configured to decrease the inductive capacitance generated by the capacitive pressure sensor TK1, such that the capacitance-to-voltage converter 20 outputs the analog voltage signal VS1 according to the decreased inductive capacitance. How much the inductive capacitance will be attenuated because of the branch circuit 120 is determined by a predetermined parameter, or according to working conditions of the pressure sensing circuit 1, such as the working temperature, the average inductive capacitance and the like, but it is not limited herein.

In the case that the inductive capacitance is attenuated by a constant value, the branch circuit 120 can further comprise a constant current circuit 120a. When the second switch SW2 is turned on by the second control signal TS2, the constant current circuit 120a attenuates the inductive capacitance generated by the capacitive pressure sensor TK1 according to a predetermined parameter, such that the capacitance-to-voltage converter 20 outputs the analog voltage signal VS1 according to the attenuated inductive capacitance. It is worth mentioning that, those skilled in the art should be familiar with the working principle of the constant current circuit 120a, and thus relevant details are omitted herein.

It should be noted that, the above predetermined parameter refers to a constant current I provided by the constant current circuit 120a. The larger the constant current I is, the more the inductive capacitance will be attenuated. The way to provide the constant current I is not restricted herein, and thus those skilled in the art can design it depending on need.

According to the above descriptions, the pressure sensing circuit 1 uses the constant current circuit 120a to attenuate the inductive capacitance generated by the capacitive pressure sensor TK1 by a constant value. Moreover, the pressure sensing circuit 1 alternatively turns on the first switch SW1, the second switch SW2 and the third switch SW3 to prevent the capacitance Cf in the capacitance-to-voltage converter 20 from dramatically changing. Thereby, the capacitance-to-voltage converter 20 can output a more stable analog voltage signal VS1.

Figure 3:
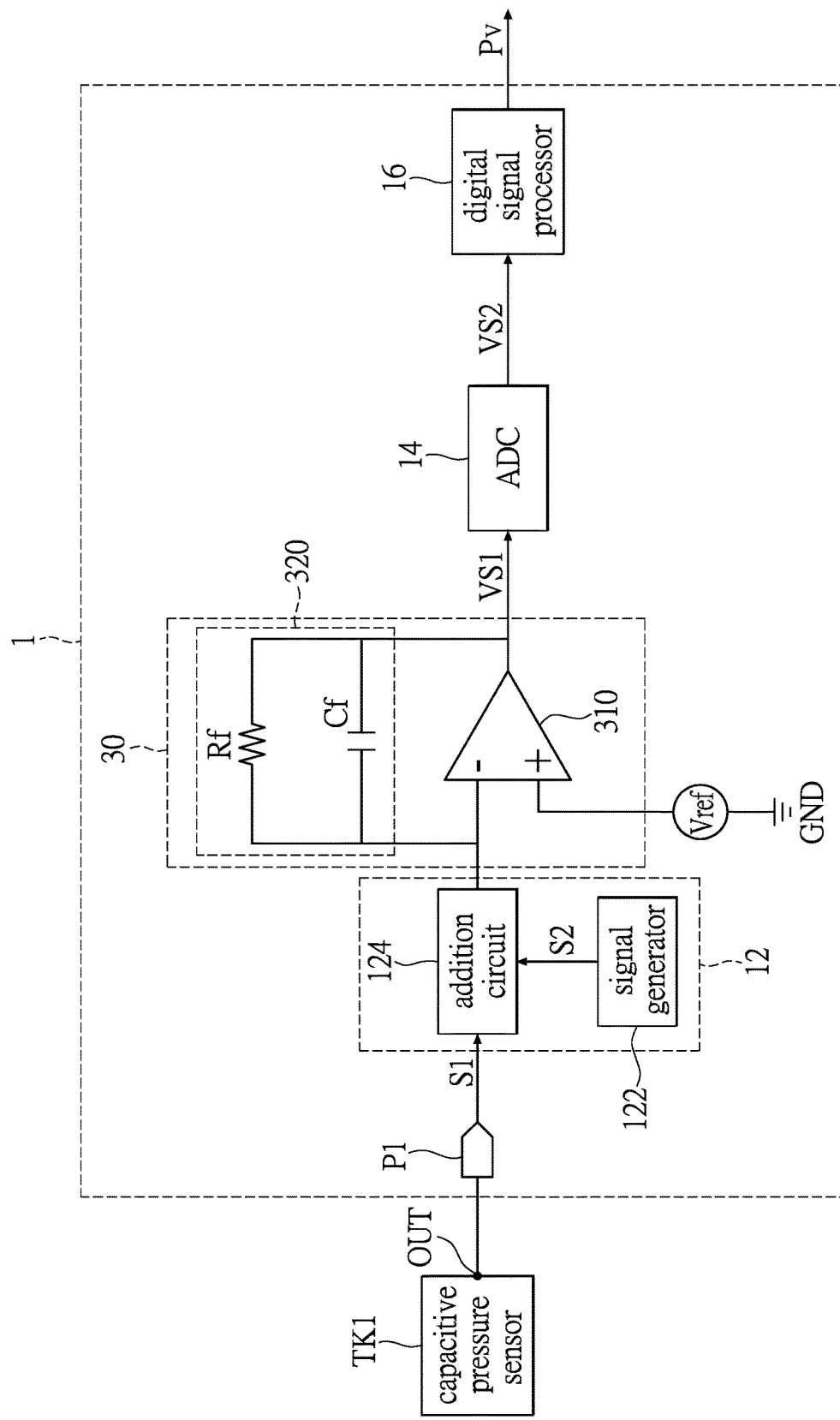
FIG. 3 is a schematic diagram showing the second preferable embodiment of the pressure sensing circuit shown in FIG. 1.

The embodiment of the constant current circuit 120a provided above is only for illustrating but not for restricting the instant disclosure. In another case, the capacitance-to-voltage converter can be considered a design of a continuous circuit. For this case, the pressure sensing circuit 1 is further illustrated in the following description by another embodiment. Referring to FIG. 3, FIG. 3 is a schematic diagram showing the second preferable embodiment of a pressure sensing circuit shown in FIG. 1. In addition, for easy instruction, similar reference numbers or symbols refer to like elements in FIG. 1, FIG. 2 and FIG. 3.

Compared with the capacitance-to-voltage converter 20 shown in FIG. 2, the capacitance-to-voltage converter 30 shown in FIG. 3 comprises an operation amplifier 310 and a negative feedback circuit 320. The inverting input end of the operation amplifier 310 is connected to the pin P1 through an addition circuit 124, the output end of the operation amplifier 310 is connected to the analog-to-digital converter 14, and the non-inverting input end of the operation amplifier 310 is connected to a reference voltage Vref.

The negative feedback circuit 320 is connected between the inverting input end and the output end of the operation amplifier 310. The negative feedback circuit 320 is composed of a capacitor Cf and a resistor Rf which are connected in parallel. It is worth mentioning that, those skilled in the art should be familiar with the working principle of the capacitance-to-voltage converter 30, and thus details relevant to the operation amplifier 310 and the negative feedback circuit 320 are omitted.

The following description provides an example illustrating how to attenuate the inductive capacitance in this embodiment. Again referring FIG. 3, the cancellation circuit 12 comprises a signal generator 122 and an addition circuit 124. The signal generator 122 generates the cancellation signal S2. The cancellation signal S2 generated by the signal generator 122 and the inductive capacitance generated by the capacitive pressure sensor TK1 have opposite polarities. In addition, the addition circuit 124 adds the cancellation signal S2 to the inductive capacitance generated by the capacitive pressure sensor TK1, and then provides the inductive capacitance to the capacitance-to-voltage converter 30.

It is worth mentioning that, the above example is only for illustrating but not for restricting the addition circuit 124. In another embodiment, when the cancellation signal S2 generated by the signal generator 122 and the inductive capacitance generated by the capacitive pressure sensor TK1 have the same polarity, the addition circuit 124 can be replaced by a subtraction circuit (not shown).

In this case, the subtraction circuit subtracts the cancellation signal S2 generated by the signal generator 122 from the inductive capacitance generated by the capacitive pressure sensor TK1, and then provides this inductive capacitance to the capacitance-to-voltage converter 30. In other words, the way to attenuate the inductive capacitance by the cancellation circuit 12 in this embodiment, such as using the addition circuit 124 or the subtraction circuit, is determined by the polarity of the cancellation signal S2 generated by the signal generator 122 or according to the need for the operation of the pressure sensing circuit 1.

From the above, the pressure sensing circuit 1 attenuates the inductive capacitance generated by the capacitive pressure sensor TK1 by the cancellation signal S2 generated by the signal generator 122. Thereby, the capacitance-to-voltage converter 30 will not have an overflow resulting when the inductive capacitance that is received by the capacitance-to-voltage converter 30 is too large, and also the capacitance-to-voltage converter 30 can effectively output an analog voltage signal VS1 corresponding to the attenuated inductive capacitance. In practice, the signal generator 122 can be, for example, a digital-to-analog converter, but it is not limited herein.

The above described "attenuated inductive capacitance" can be zero or larger than zero. In other words, the way to attenuate the inductive capacitance can be attenuating the inductive capacitance to zero or to a value which is larger than zero. However, it is not limited herein. The signal generator 122 can be programmable and can be programmed for determining that the cancellation signal is small or large according to the inductive capacitance generated by the capacitive pressure sensor TK1.

In another embodiment, the cancellation signal S2 generated by the signal generator 122 can be equal to the inductive capacitance generated by the capacitive pressure sensor TK1 when the capacitive pressure sensor TK1 has not been applied with any pressure. In this case, the pressure sensing circuit 1 can use the cancellation signal S2 generated by the signal generator 122 to entirely cancel the inductive capacitance generated by the capacitive pressure sensor TK1 when the capacitive pressure sensor TK1 has not been applied with any pressure (in other words, the sensing signal S1 received by the capacitance-to-voltage converter 30 will be zero). In addition, the pressure sensing circuit 1 can use the cancellation signal S2 to attenuate the inductive capacitance by a constant value, which is generated when the capacitive pressure sensor TK1 is applied with a pressure. In this manner, the capacitance-to-voltage converter 30 will not receive too large an inductive capacitance that results in an overflow.

According to the above description, the pressure sensing circuits 1 shown in FIG. 2 and FIG. 3 both can use the cancellation circuit 12 to attenuate the inductive capacitance generated by the capacitive pressure sensor TK1 by a constant value or a non-constant value, before it is inputted to the converter 10, such as the capacitance-to-voltage converters 20 and 30. Thereby, the capacitance-to-voltage converter 30 will not have an overflow resulting when the inductive capacitance that is received by the capacitance-to-voltage converter 30 is too large, and also the capacitance-to-voltage converter 30 can effectively output an analog voltage signal VS1 corresponding to the attenuated inductive capacitance.

On the other hand, in the case that the possibility of the overflow of the converter 10 is not considered, the cancellation circuit 12 can attenuate the analog voltage signal VS1 after the converter 10 outputs the analog voltage signal VS1 according to the inductive capacitance generated by the capacitive pressure sensor TK1. As a result, the analog-todigital converter 14 generates a digital voltage signal VS2 according to the attenuated analog voltage signal VS1.

Figure 4:
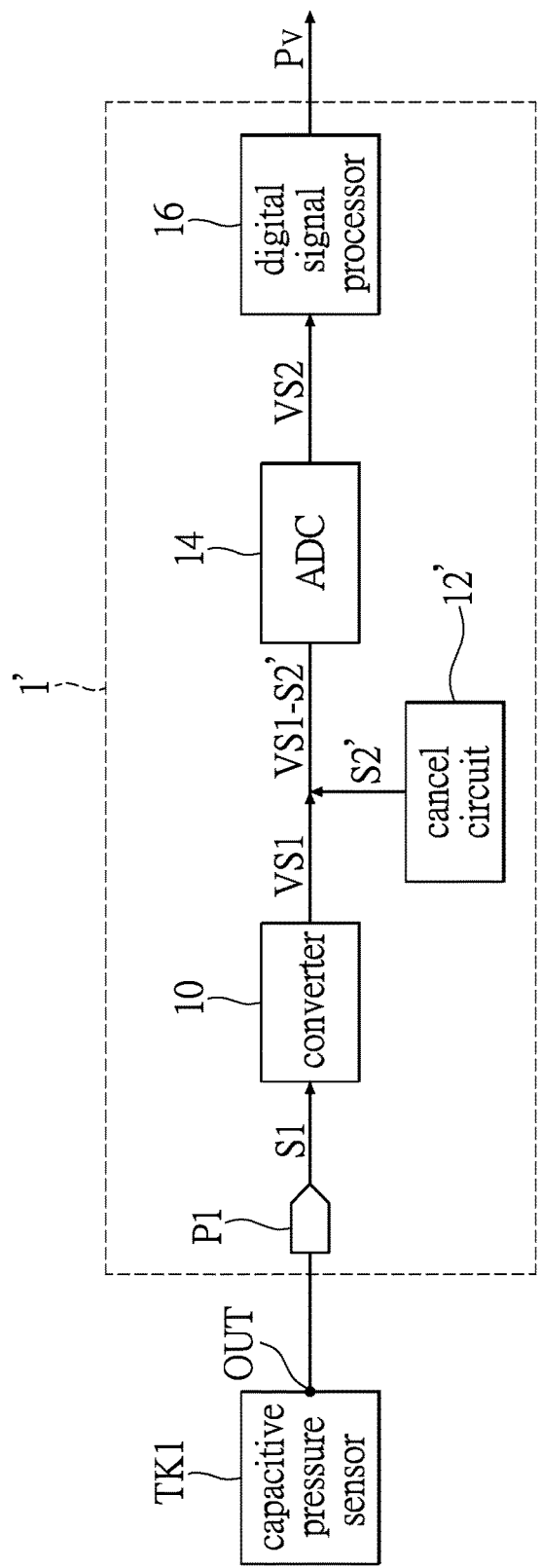
FIG. 4 shows a block diagram of a capacitive pressure sensing circuit of another embodiment of the instant disclosure.

Referring to FIG. 4, FIG. 4 shows a block diagram of a capacitive pressure sensing circuit of another embodiment of the instant disclosure. In addition, for easy instruction, similar reference numbers or symbols refer to like elements in FIG. 4 and FIG. 1.

Figure 5:
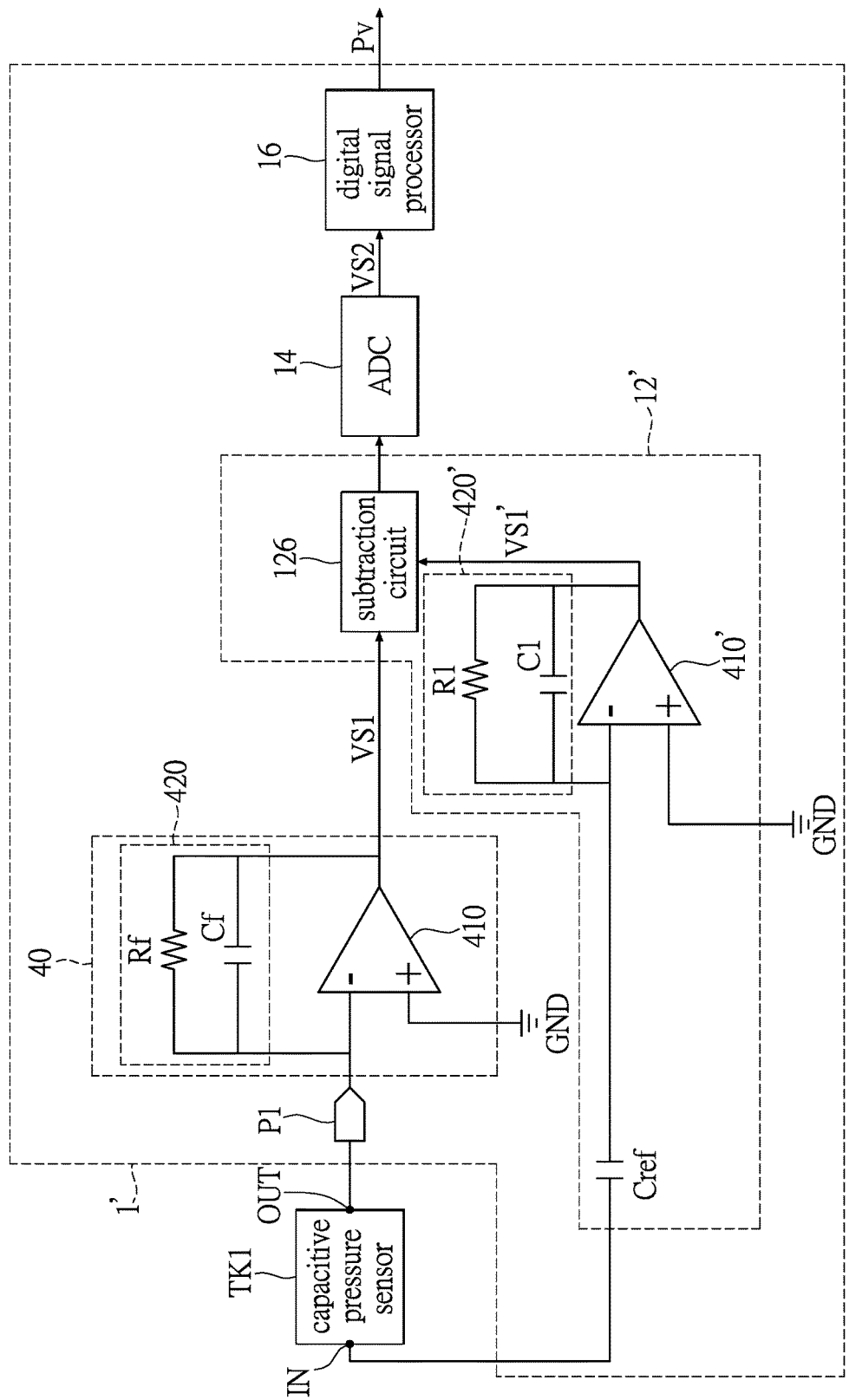
FIG. 5 is a schematic diagram showing the first preferable embodiment of the pressure sensing circuit shown in FIG. 4.

Compared with the cancellation circuit 12 in FIG. 1, the cancellation circuit 12' in FIG. 4 is connected between the converter 10 and the analog-to-digital converter 14 to generate a cancellation signal S2', such that the analog-to-digital converter 14 generates a digital voltage signal VS2 according to an analog voltage signal VS1 from which the cancellation signal S2' is subtracted. The following description is to provide an embodiment illustrating the pressure sensing circuit 1' in this embodiment. Referring to FIG. 5, FIG. 5 is a schematic diagram showing the first preferable embodiment of a pressure sensing circuit shown in FIG. 4. For easy instruction, similar reference numbers or symbols refer to like elements in FIG. 5 and FIG. 4.

In the embodiment shown by FIG. 5, the converter 10 can be, for example, a capacitance-to-voltage converter 40 that comprises an operation amplifier 410 and a negative feedback circuit 420. The inverting input end of the operation amplifier 410 is connected to a pin P1, and the non-inverting input end of the operation amplifier 410 is connected to a grounding voltage GND. In addition, the output end of the operation amplifier 410 is connected to an analog-to-digital converter 14 through a subtraction circuit 126. Moreover, the negative feedback circuit 420 is connected between the inverting input end and the output end of the operation amplifier 410. The negative feedback circuit 420 is composed of a capacitor Cf and a resistor Rf connected in parallel. Those skilled in the art should be familiar with the working principle of the capacitance-to-voltage converter 40, and thus details relevant to the operation amplifier 410 and the negative feedback circuit 420 are omitted herein.

The cancellation circuit 12' in FIG. 5 comprises the subtraction circuit 126, an operation amplifier 410', a negative feedback circuit 420' and a reference capacitor Cref. The non-inverting input end of the operation amplifier 410' is connected to the grounding voltage GND, and the output end of the operation amplifier 410' is connected to the subtraction circuit 126. In addition, the inverting input end of the operation amplifier 410' is connected to an input end IN of the capacitive pressure sensor. The negative feedback circuit 420' is connected between the inverting input end and the output end of the operation amplifier 410', and the negative feedback circuit 420' is composed of a capacitor C1 and a resistor R1 which are connected in parallel. The reference capacitor Cref is connected between the inverting input end of the operation amplifier 410' and the input end IN of the capacitive pressure sensor TK1.

In this embodiment, the operation amplifier 410' and the negative feedback circuit 420' can be considered a capacitance-to-voltage converter 40 of another branch circuit. Thus, in the above description, the capacitor C1 can be equal to the capacitor Cf and the resistor R1 can be equal to the resistor Rf. However, the implementation of the capacitance-to-voltage converter 40 of another branch circuit is not restricted, and thus the operation amplifier 410' and the feedback circuit 420' can be designed by those skilled in the art depending on need.

Specifically speaking, the operation amplifier 410', the negative feedback circuit 420', the reference capacitor Cref and the capacitance-to-voltage converter 40 can be all configured on the same chip. Only when a driving signal (not shown) is inputted to the input end IN of the capacitive pressure sensor TK1 to turn on the capacitive pressure sensor TK1 for sensing, the cancellation circuit 12' uses a cancellation signal S2' to make the operation amplifier 410' output a reference voltage signal VS1' according to the capacitance of the reference capacitor Cref. In addition, the subtraction circuit 126 executes a subtraction operation for the analog voltage signal VS1 outputted by the capacitance-to-voltage converter 40 and the reference voltage signal VS1' outputted by the operation amplifier 410', and then provides an operation result to the analog-to-digital converter 14.

From the above, the analog-to-digital converter 14 generates a digital voltage signal VS2 according to the attenuated analog voltage signal VS1. The above mentioned "operation result" can be zero or not zero. Thus, the cancellation circuit 12' can be programmed to determine the capacitance of the reference capacitor Cref according to the inductive capacitance generated by the capacitive pressure sensor TK1, such that the operation amplifier 410' can output a reference voltage signal VS1' according to the capacitance of the reference capacitor Cref wherein the reference voltage signal VS1' can be larger than, smaller than or equal to the analog voltage signal VS1.

In another embodiment, the capacitance of the reference capacitor Cref can be predetermined to be equal to the inductive capacitance of the capacitive pressure sensor TK1 when the capacitive pressure sensor TK1 has not been applied with any pressure. When the capacitive pressure sensor TK1 has not been applied with any pressure and when a driving signal is inputted to the input end IN of the capacitive pressure sensor TK1, the pressure sensing circuit 1' shown in FIG. 5 uses the reference voltage signal VS1' outputted by the operation amplifier 410' to entirely cancel the analog voltage signal VS1 generated by the capacitance-to-voltage converter 40. As a result, the analog voltage signal VS1 received by the analog-to-digital converter 14 must be zero.

When the capacitive pressure sensor TK1 is applied with a pressure (in this case, the inductive capacitance must be larger than the capacitance of the reference capacitor Cref) and when the driving signal is inputted to the input end IN of the capacitive pressure sensor TK1, the pressure sensing circuit 1' can execute a subtraction operation for the reference voltage signal VS1' outputted by the operation amplifier 410' and the analog voltage signal VS1 generated by the capacitance-to-voltage converter 40. Specifically speaking, the pressure sensing circuit 1' subtracts the reference voltage signal VS1', which is a constant value, from the analog voltage signal VS1. After that, the analog-to-digital converter 14 generates a digital voltage signal VS2 according to the operation result of the above subtraction operation. It is worth mentioning that, the above example is only for illustrating but not for restricting the instant disclosure, and those skilled in the art can design the capacitance of the reference capacitor Cref according to need.

Figure 6:
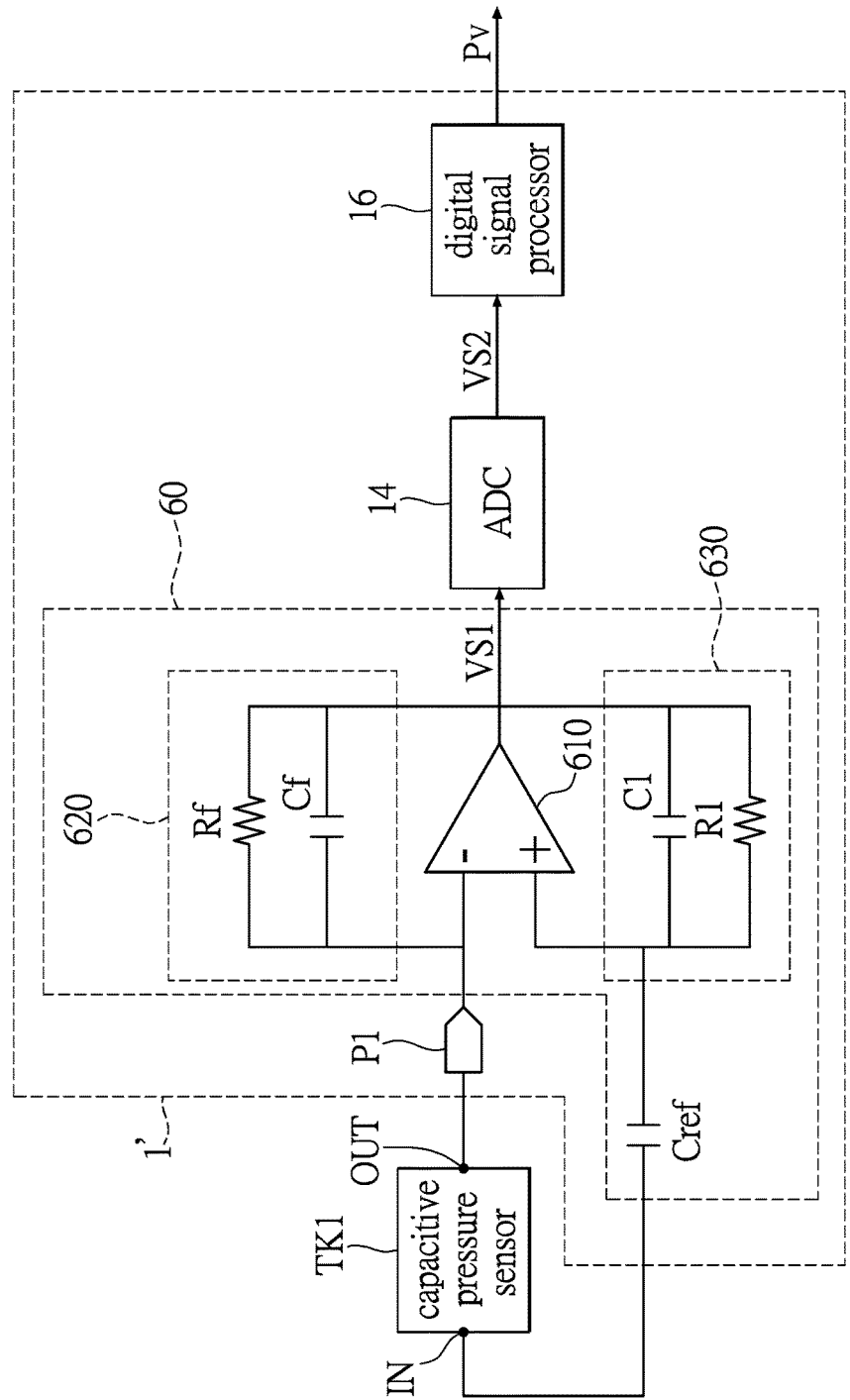
FIG. 6 is a schematic diagram showing the second preferable embodiment of the pressure sensing circuit shown in FIG. 4.

Another embodiment is also provided to illustrate the pressure sensing circuit 1' in this embodiment. Referring to FIG. 6, FIG. 6 is a schematic diagram showing the second preferable embodiment of a pressure sensing circuit shown in FIG. 4. For easy instruction, similar reference numbers or symbols refer to like elements in FIGS. 4-6.

Compared with the cancellation circuit 12' shown in FIG. 5, the cancellation circuit shown in FIG. 6 can be directly integrated into the capacitance-to-voltage converter 60. Thus, in this embodiment, the capacitance-to-voltage converter 60 comprises an operation amplifier 610, a negative feedback circuit 620, a positive feedback circuit 630 and a reference capacitor Cref. The inverting input end of the operation amplifier 610 is connected to a pin P1, and the non-inverting input end of the operation amplifier 610 is connected to the input end IN of the capacitive pressure sensor TK1 through the reference capacitor Cref.

In addition, the output end of the operation amplifier 610 is connected to the analog-to-digital converter 14. The negative feedback circuit 620 is connected between the inverting input end and the output end of the operation amplifier 610, and the positive feedback circuit 630 is connected between the non-inverting input end and the output end of the operation amplifier 610.

The negative feedback circuit 620 is composed by a capacitor Cf and a resistor Rf that are connected in parallel, and the positive feedback circuit 630 is composed by a capacitor C1 and a resistor R1 that are connected in parallel. Those skilled in the art should be familiar with the working principle of the operation amplifier 610, the negative feedback circuit 620 and the positive feedback circuit 630, and thus details relevant to the operation amplifier 610, the negative feedback circuit 620 and the positive feedback circuit 630 are omitted herein.

Also, according to the inductive capacitance generated by the capacitive pressure sensor, the pressure sensing circuit 1' in this embodiment can be programmed to determine the capacitance of the reference capacitor Cref, such that the capacitance-to-voltage converter 60 can output an attenuated analog voltage signal VS1 to the analog-to-digital converter 14 according to the reference capacitor Cref.

In another embodiment, the capacitance of the reference capacitor Cref can be predetermined to be equal to the inductive capacitance generated by the capacitive pressure sensor TK1 when the capacitive pressure sensor TK1 has not been applied with any pressure. When the capacitive pressure sensor TK1 has not been applied with any pressure and when a driving signal is inputted to the input end IN of the capacitive pressure sensor TK1, the pressure sensing circuit 1' in FIG. 6 can use the capacitance-to-voltage converter 60 to output an analog voltage signal VS1 which is zero.

On the other hand, when the capacitive pressure sensor TK1 is applied with a pressure (in this case, the inductive capacitance must be larger than the capacitance of the reference capacitor Cref) and when the driving signal is inputted to the input end IN of the capacitive pressure sensor TK1, the pressure sensing circuit 1' in FIG. 6 can use the capacitance-to-voltage converter 60 to output an attenuated analog voltage signal VS1. Thereby, the analog-to-digital converter 14 generates a digital voltage signal VS2 according to the attenuated analog voltage signal VS1.

Figure 7:
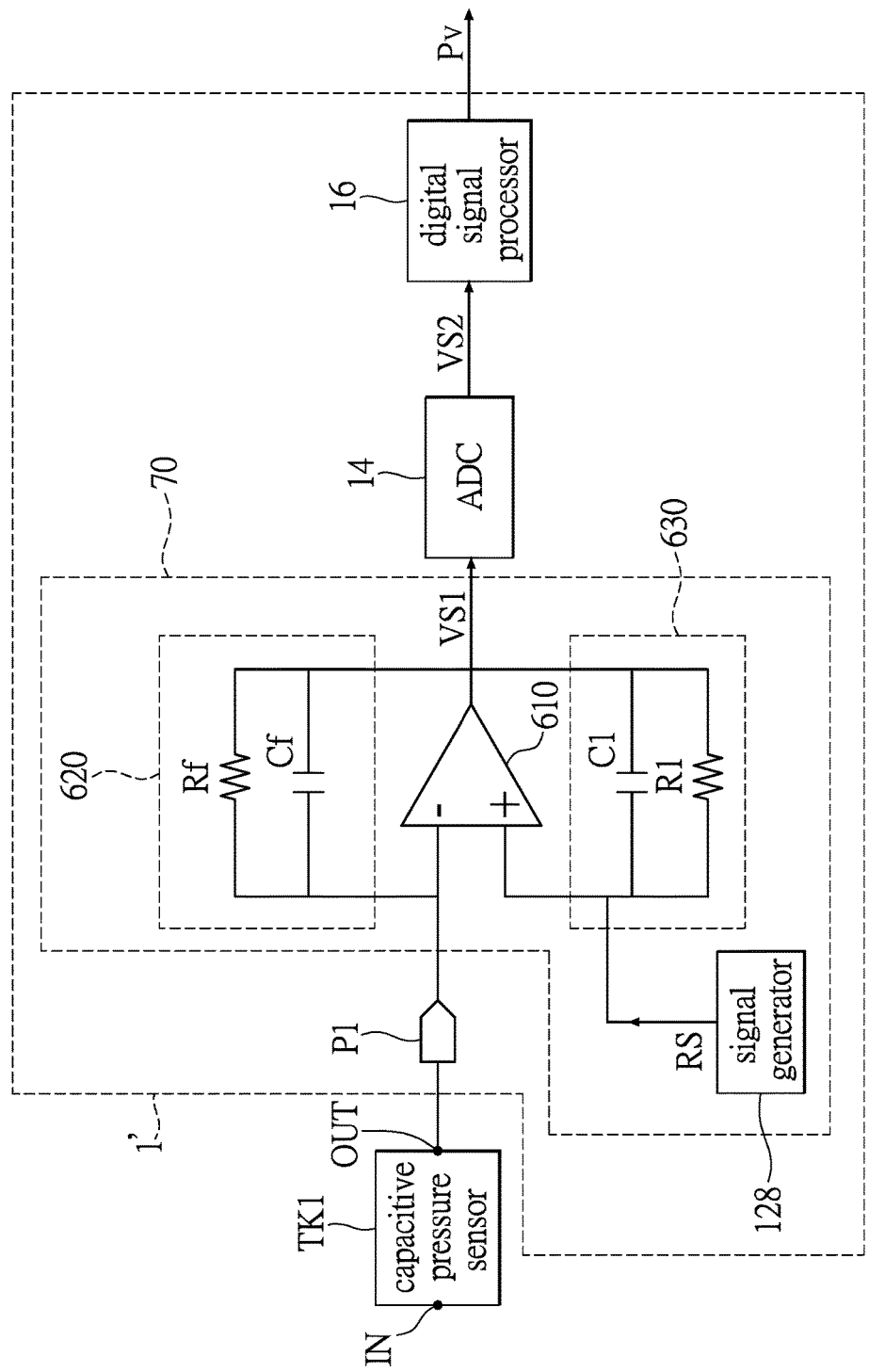
FIG. 7 is a schematic diagram showing the third preferable embodiment of the pressure sensing circuit shown in FIG. 4.

The above example is only for illustrating but not for restricting the instant disclosure, and thus those skilled in the art can design the capacitance of the reference capacitor Cref depending on need. Moreover, referring to FIG. 7, FIG. 7 is a schematic diagram showing the third preferable embodiment of a pressure sensing circuit shown in FIG. 4. For easy instruction, similar reference numbers or symbols refer to like elements in FIGS. 4-7.

Compared with the capacitance-to-voltage converter 60 in FIG. 6, in the capacitance-to-voltage converter 70 in FIG. 7, the non-inverting input end of the operation amplifier 610 is directly connected to a signal generator 128. Briefly, the capacitance of the reference capacitor Cref in FIG. 6 can be represented by the reference signal RS generated by the signal generator 128 in FIG. 7.

In another embodiment, the reference signal RS generated by the signal generator 128 can be predetermined to be the inductive capacitance generated by the capacitive pressure sensor TK1 when the capacitive pressure sensor TK1 has not been applied with any pressure.

Thereby, when the capacitive pressure sensor TK1 is not applied with any pressure and when the driving signal (not shown) is inputted to the input end IN of the capacitive pressure sensor TK1, the pressure sensing circuit 1' in FIG. 7 can use the capacitance-to-voltage converter 70 to output an analog voltage signal VS1 which is zero. On the other hand, when the capacitive pressure sensor TK1 is applied with a pressure (in this case, the inductive capacitance must be larger than the reference RS) and when the driving signal is inputted to the input end IN of the capacitive pressure sensor TK1, the pressure sensing circuit 1' in FIG. 7 can use the capacitance-to-voltage converter 70 to output an attenuated analog voltage signal VS1, such that the analog-to-digital converter 14 can generate a digital voltage signal VS2 according to the attenuated analog voltage signal VS1.

In practice, the signal generator 128 can be, for example, a digital-to-analog converter, but it is not limited herein. In addition, those skilled in the art should be familiar with the working principle of the capacitance-to-voltage converter 70 and thus details relevant to the capacitance-to-voltage converter 70 are omitted herein.

From the above, compared with the pressure sensing circuit 1 shown in FIG. 2 or FIG. 3, the pressure sensing circuit 1' in FIG. 5, FIG. 6 or FIG. 7 attenuates an analog voltage signal VS1 by the cancellation circuit 12' (or by the capacitance-to-voltage converter 60 or 70) just before the analog voltage signal VS1 is going to be inputted to the analog-to-digital converter 14. Thereby, the analog-to-digital converter 14 can generate a digital voltage signal) VS2 according to the attenuated analog voltage signal VS1.

Figure 8:
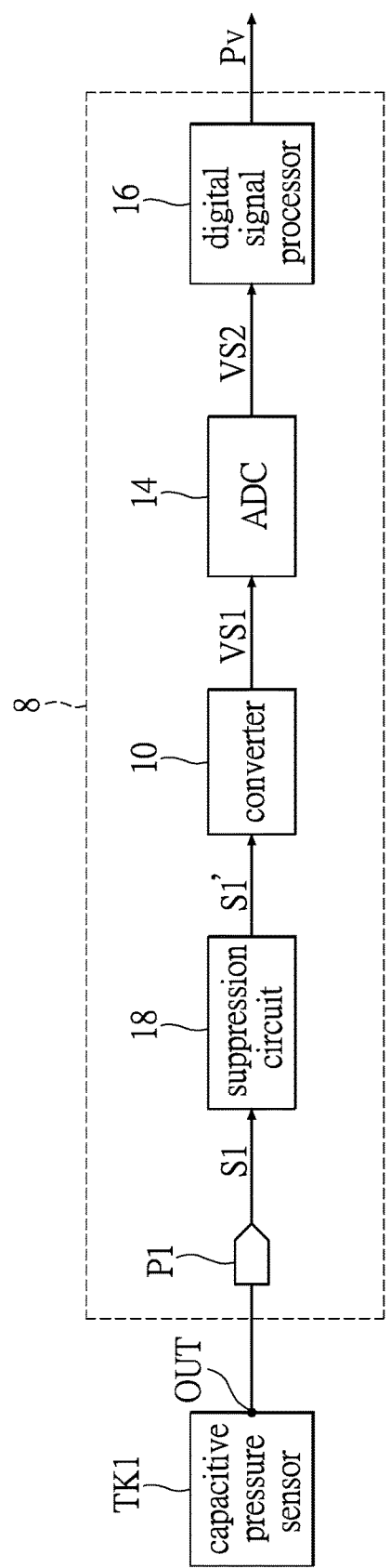
FIG. 8 shows a block diagram of a capacitive pressure sensing circuit of still another embodiment of the instant disclosure.

As mentioned, the way to attenuate the inductive capacitance in the instant disclosure is not restricted, and thus there is another embodiment provided to illustrate it. Referring to FIG. 8, FIG. 8 shows a block diagram of a capacitive pressure sensing circuit of still another embodiment of the instant disclosure. For easy instruction, similar reference numbers or symbols refer to like elements in FIG. 8 and FIG. 1.

Compared with the pressure sensing circuit shown in FIG. 1, in addition to the converter 10, an analog-to-digital converter 14 and a digital signal processor 16, the pressure sensing circuit 8 shown in FIG. 8 also comprises a suppression circuit 18. The cancellation circuit 12 in FIG. 2 executes a subtraction operation for the sensing signal (or the conductive capacitance) to eliminate part of the inductive capacitance; however, compared with the cancellation circuit 12 in FIG. 2, the suppression circuit 18 executes a division operation for the sensing signal (or the conductive capacitance) to attenuate the sensing signal (or the conductive capacitance) proportionally. For ease of understanding, only one capacitive pressure sensor TK1~TKN is used to described this embodiment (that is, N=1), but it is not limited herein. In addition, each of the above elements can be implemented all by hardware circuits, or by the combination of a hardware circuit and firmware or software, and it is not limited herein.

Figure 9:
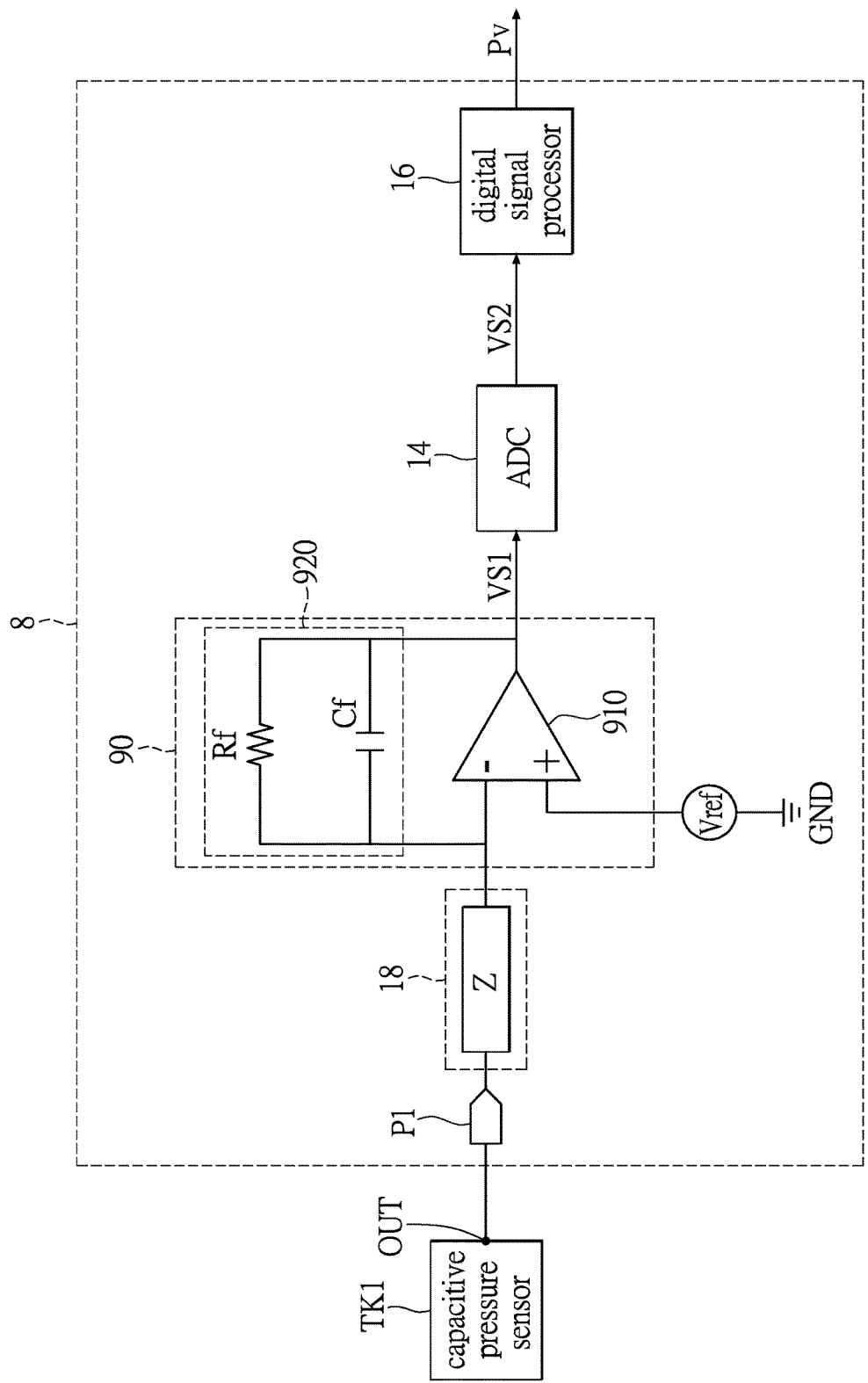
FIG. 9 is a schematic diagram showing the first preferable embodiment of the pressure sensing circuit shown in FIG. 8.

The suppression circuit 18 is connected between the converter 10 and a pin P1. The suppression circuit 18 suppresses the sensing signal S1 and provided a suppressed sensing signal S1' to the converter, such that the converter 10 outputs an analog voltage signal VS1 according to the suppressed sensing signal S1'. How much the suppression circuit 18 suppresses the sensing signal S1 can be determined by a predetermined parameter, or can be determined according to the operation conditions of the pressure sensing circuit 8, such as the working temperature, the average inductive capacitance and the like. Moreover, as mentioned, the inductive capacitance generated by the capacitive pressure sensor TK1 can be represented by the sensing signal S1. Based on that, there is an embodiment provided in the following description to illustrate the pressure sensing circuit 8. Referring to FIG. 9, FIG. 9 is a schematic diagram showing the first preferable embodiment of a pressure sensing circuit shown in FIG. 8. For an easy instruction, similar reference numbers or symbols refer to elements alike in FIG. 9 and FIG. 8.

In this embodiment, the converter 10 can be, for example, a capacitance-to-voltage converter 90, and the capacitance-to-voltage converter 90 mainly comprises an operation amplifier 910 and a negative feedback circuit 920. The inverting input end of the operation amplifier 910 is connected to the pin P1 through the suppression circuit, and the output end of the operation amplifier 910 is connected to the analog-to-digital converter 14. In addition, the non-inverting input end of the operation amplifier 910 is connected to a reference voltage Vref.

The negative feedback circuit 920 is connected between the inverting input end and the output end of the operation amplifier 910. Additionally, the negative feedback circuit 920 is composed of a capacitor Cf and a resistor Rf that are connected in parallel. Those skilled in the art should be familiar with the working principle of the capacitance-to-voltage converter 90, and thus details relevant to the operation amplifier 910 and the negative feedback circuit are omitted herein.

For example, the suppression circuit 18 can be, for example, an impedance component Z. The impedance component Z is connected between the inverting input end of the operation amplifier 910 and the pin P1, and the impedance of the impedance component Z is taken as the above predetermined parameter for suppressing the inductive capacitance generated by the capacitive pressure sensor TK1. As a result, the capacitance-to-voltage converter 90 outputs the capacitance-to-voltage converter VS1 according to the suppressed inductive capacitance. Those skilled in the art should be familiar with the working principle of using the impedance component for suppressing the inductive capacitance, and thus the relevant details are omitted herein.

The impedance component Z can be at least one passive component. In other words, the impedance component Z can be a resistor, a capacitor, an inductor or the combination thereof. The implementation of the impedance component Z is not restricted in the instant disclosure and can be determined by those skilled in the art depending on need. Moreover, the impedance component Z can be integrated in the capacitance-to-voltage converter 90 or can be configured independently.

Compared with the cancellation circuit 12 in FIG. 1, the suppression circuit 18 in FIG. 9 attenuates the inductive capacitance by executing a division operation. However, using the impedance component is only one of the ways to suppress the inductive capacitance generated by the capacitive pressure sensor TK1, and it is not limited herein.

Figure 10:
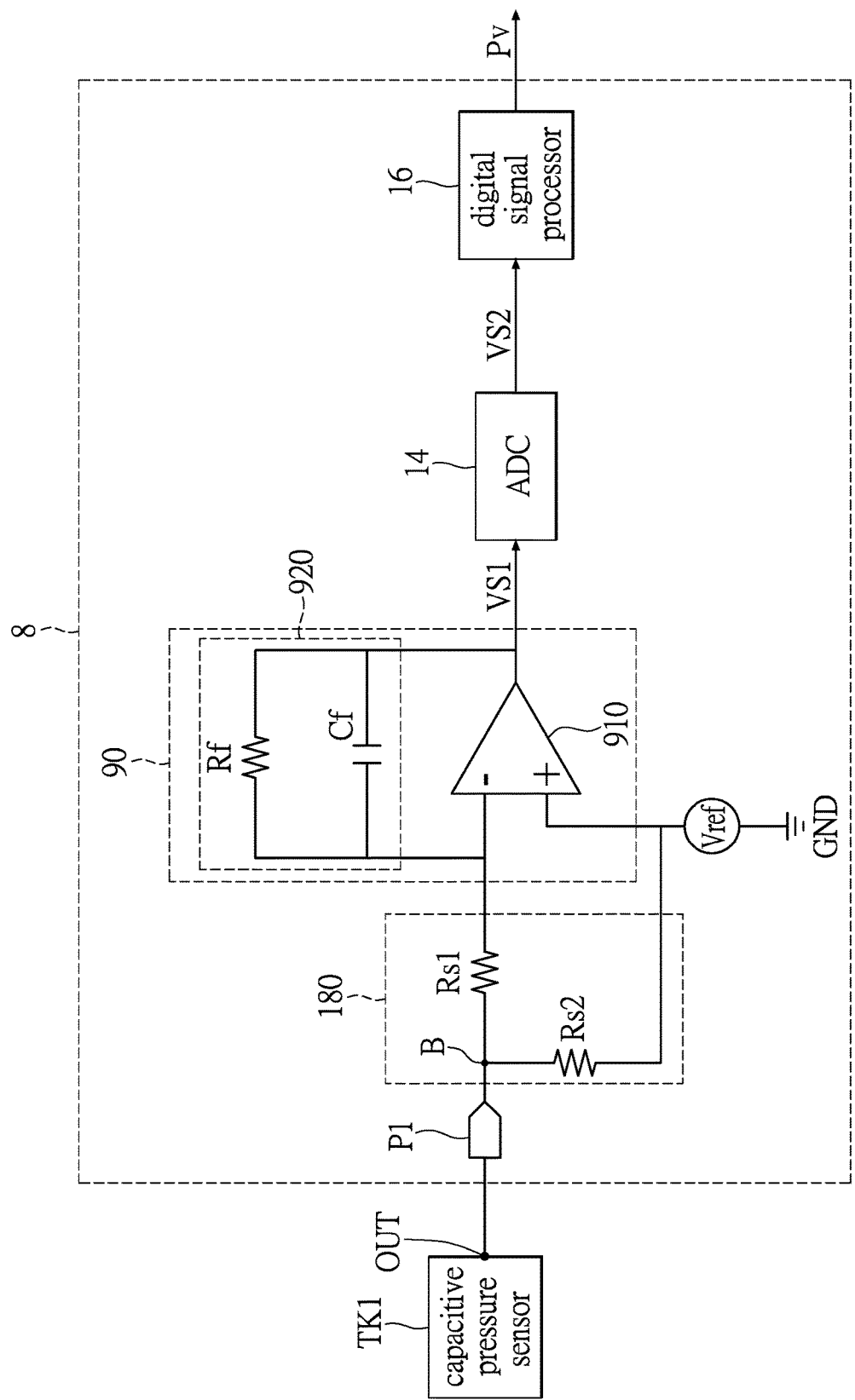
FIG. 10 is a schematic diagram showing the second preferable embodiment of the pressure sensing circuit shown in FIG. 8.

In other embodiments, the suppression circuit 18 can also be a branch circuit. Referring to FIG. 10, FIG. 10 is a schematic diagram showing the second preferable embodiment of a pressure sensing circuit shown in FIG. 8. For easy instruction, similar reference numbers or symbols refer to like elements in FIG. 10 and FIG. 9.

As shown in FIG. 10, the voltage dividing circuit 180 comprises a resistor Rs1 and another resistor Rs2. The resistor Rs1 is connected between the inverting input end of the operation amplifier 910 and a pin P1. One end of the resistor Rs2 is connected to a node B between the resistor Rs1 and the pin P1, and the other end of the resistor Rs2 is connected to a reference voltage Vref.

The suppression circuit 18 takes the impedance ratio between the resistor Rs1 and the resistor Rs2 as a predetermined parameter. Based on this predetermined parameter, the suppression circuit 18 suppresses the inductive capacitance generated by the capacitive pressure sensor TK1, such that the capacitance-to-voltage converter 90 outputs an analog voltage signal VS1 according to the suppressed inductive capacitance. Those skilled in the art should be familiar with the working principle of the voltage dividing circuit 180, and thus details relevant to the voltage dividing circuit 180 are omitted herein.

Figure 11:
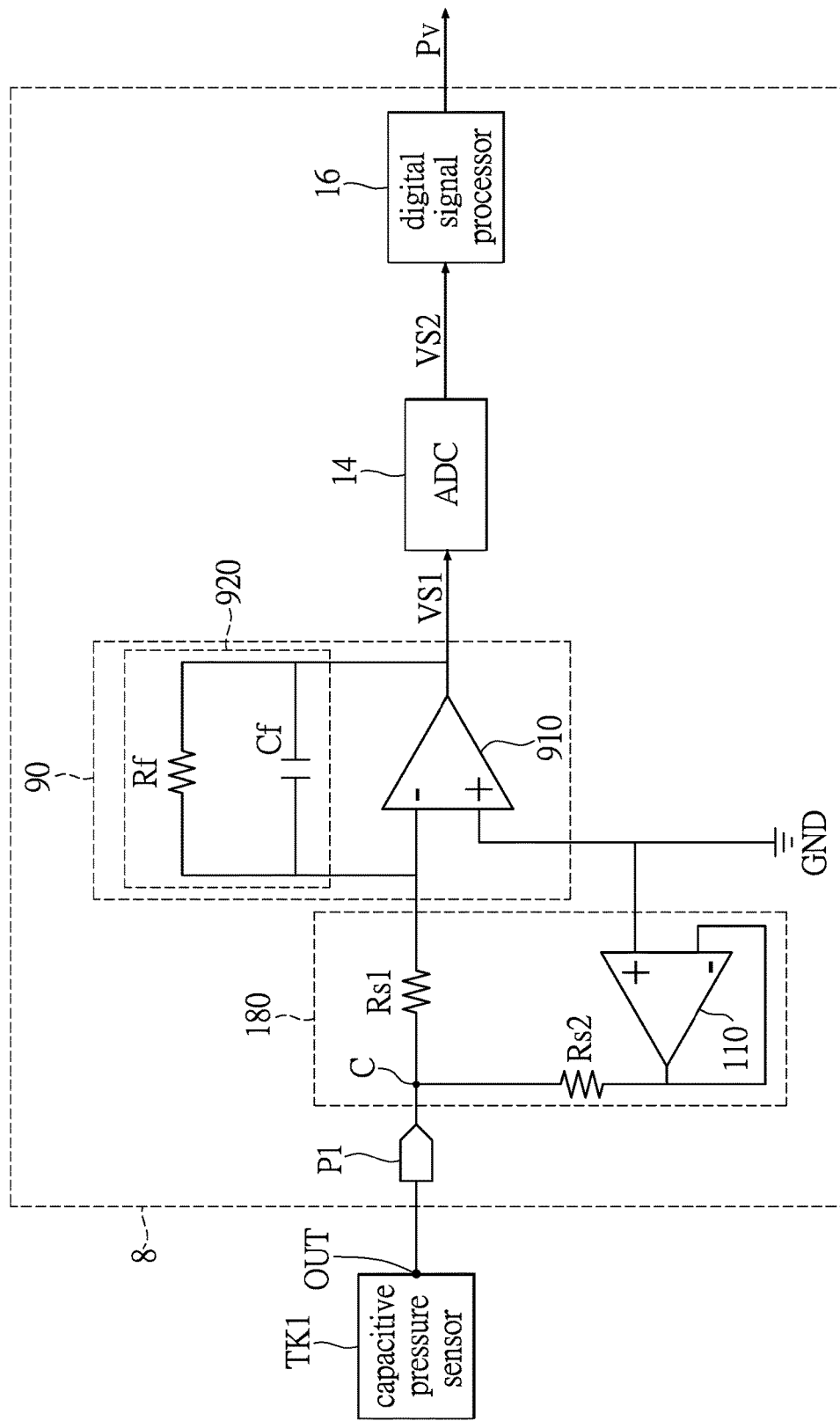
FIG. 11 is a schematic diagram showing the third preferable embodiment of the pressure sensing circuit shown in FIG. 8.

The above mentioned reference voltage Vref can be, for example, a grounding voltage GND. In this case, referring to FIG. 11, FIG. 11 is a schematic diagram showing the third preferable embodiment of a pressure sensing circuit shown in FIG. 8. For easy instruction, similar reference numbers or symbols refer to like elements in FIG. 11 and FIG. 10.

As shown in FIG. 11, the suppression circuit 18 comprises a resistor Rs1, another resistor Rs2 and an operation amplifier 110. The resistor Rs1 is connected between the inverting input end of the operation amplifier 910 and a pin P1. The non-inverting input end of the operation amplifier 110 is connected to a grounding voltage GND, and the inverting input end of the operation amplifier 110 is connected to an output end of the operation amplifier 110. In addition, the first end of the resistor Rs2 is connected to a node C between the pin P1 and the resistor Rs2, and the second end of the resistor Rs2 is connected to an output end of the operation amplifier 110. Those skilled in the art should be familiar with the working principle of the suppression circuit 18, and thus details relevant to the suppression circuit 18 are omitted herein.

From the above, the capacitive pressure sensing circuit provided by the instant disclosure can directly convert the inductive capacitance generated by a capacitive pressure sensor to a corresponding voltage value. Moreover, the pressure sensing circuit provided by the instant disclosure can use different ways to attenuate the inductive capacitance. For example, the pressure sensing circuit can attenuate the inductive capacitance by using a cancellation circuit or a suppression circuit. By using either one, the pressure sensing circuit provided by the instant disclosure can prevent an overflow from happening when the inductive capacitance received by the capacitance-to-voltage converter is too large, such that the capacitance-to-voltage converter can effectively output an analog voltage signal corresponding to the attenuated inductive capacitance.

Figure 12:
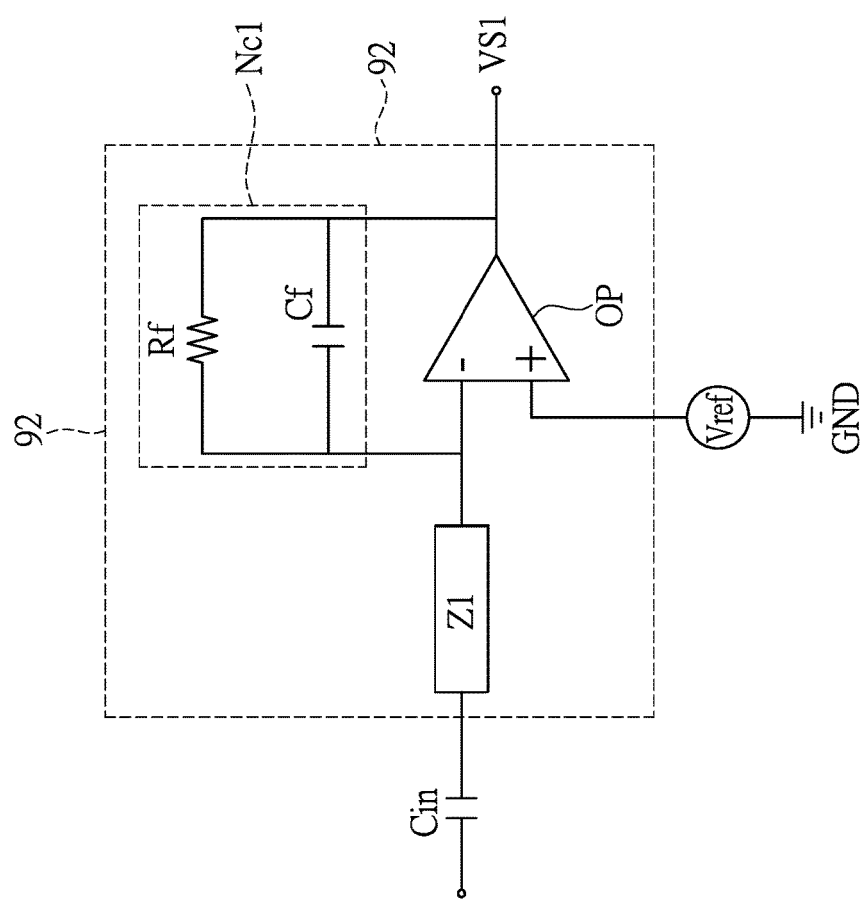
FIG. 12 shows a circuit diagram of a capacitance-to-voltage converter of one embodiment of the instant disclosure.

To further illustrate details relevant to the capacitance-to-voltage converter in the pressure sensing circuit, there are several embodiments of the capacitance-to-voltage converter provided. Referring to FIG. 12, FIG. 12 shows a circuit diagram of a capacitance-to-voltage converter of one embodiment of the instant disclosure. In this embodiment, the capacitance-to-voltage converter 92 can be considered a combination of the converter 10 and the suppression circuit 18 in FIG. 8. For easy instruction, similar reference numbers or symbols refer to like elements in FIG. 12 and FIG. 8.

As shown in FIG. 12, the capacitance-to-voltage converter 92 comprises an operation amplifier OP, a negative feedback circuit Nc1 and an impedance component Z1. The inverting input end of the operation amplifier OP is connected to an input capacitor Cin, the non-inverting input end of the operation amplifier OP is connected to a reference voltage Vref, and the output end of the operation amplifier OP outputs an analog voltage signal VS1 according to the input capacitor Cin.

The negative feedback circuit Nc1 is connected between the inverting input end and the output end of the operation amplifier OP. The negative feedback circuit Nc1 is composed of a capacitor Cf and a resistor Rf that are connected in parallel. The impedance component Z1 is connected between the inverting input end of the operation amplifier OP and the input capacitor Cin. The impedance component Z1 suppresses the capacitance of the input capacitor Cin according to a predetermined parameter, such that the output end of the operation amplifier OP outputs the analog voltage signal VS1 according to the suppressed capacitance of the input capacitor Cin.

It should be noted that, the above mentioned predetermined parameter refers to the impedance of the impedance component Z1. A larger impedance of the impedance component Z1 suppresses the capacitance of the input capacitor Cin more. In addition, the impedance component Z1 comprises at least one passive element, and the capacitance-to-voltage converter 92 will not have an overflow, because of the impedance component Z1.

Figure 13:
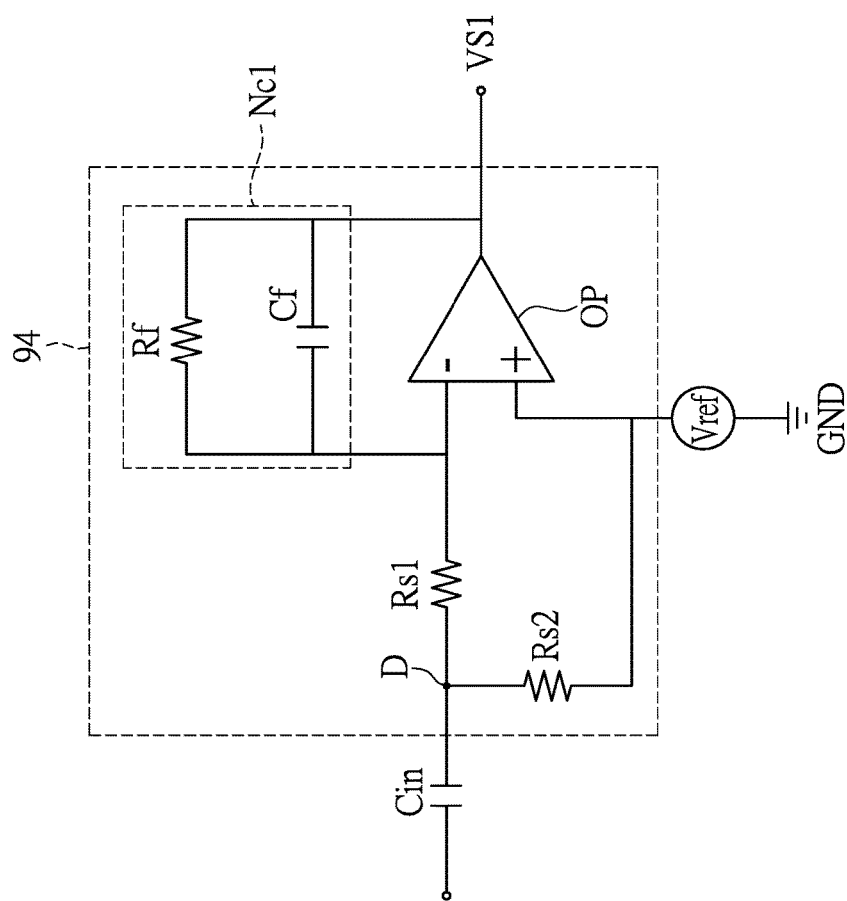
FIG. 13 shows a circuit diagram of a capacitance-to-voltage converter of another embodiment of the instant disclosure.

Moreover, referring to FIG. 13, FIG. 13 shows a circuit diagram of a capacitance-to-voltage converter of another embodiment of the instant disclosure. For easy instruction, similar reference numbers or symbols refer to like elements in FIG. 13 and FIG. 12.

Compared with the capacitance-to-voltage converter 92 in FIG. 12, the capacitance-to-voltage converter 94 in FIG. 13 comprises an operation amplifier OP, a negative feedback circuit Nc1, a resistor Rs1 and another resistor Rs2. The resistor Rs1 is connected between the inverting input end of the operation amplifier OP and an input capacitor Cin. The first end of the resistor Rs2 is connected to a node D between the resistor Rs1 and the input capacitor Cin, and the second end of the resistor Rs2 is connected to a reference voltage Vref.

The capacitance-to-voltage converter 94 takes the impedance ratio between the resistor Rs1 and the resistor Rs2 as a predetermined parameter to suppress the capacitance of the input capacitor Cin, such that the capacitance-to-voltage converter 94 outputs an analog voltage signal VS1 according to the suppressed capacitance of the input capacitor Cin. Those skilled in the art should be familiar with the working principle of the capacitance-to-voltage converter 94, and thus details relevant to the capacitance-to-voltage converter 94 are omitted herein.

Figure 14:
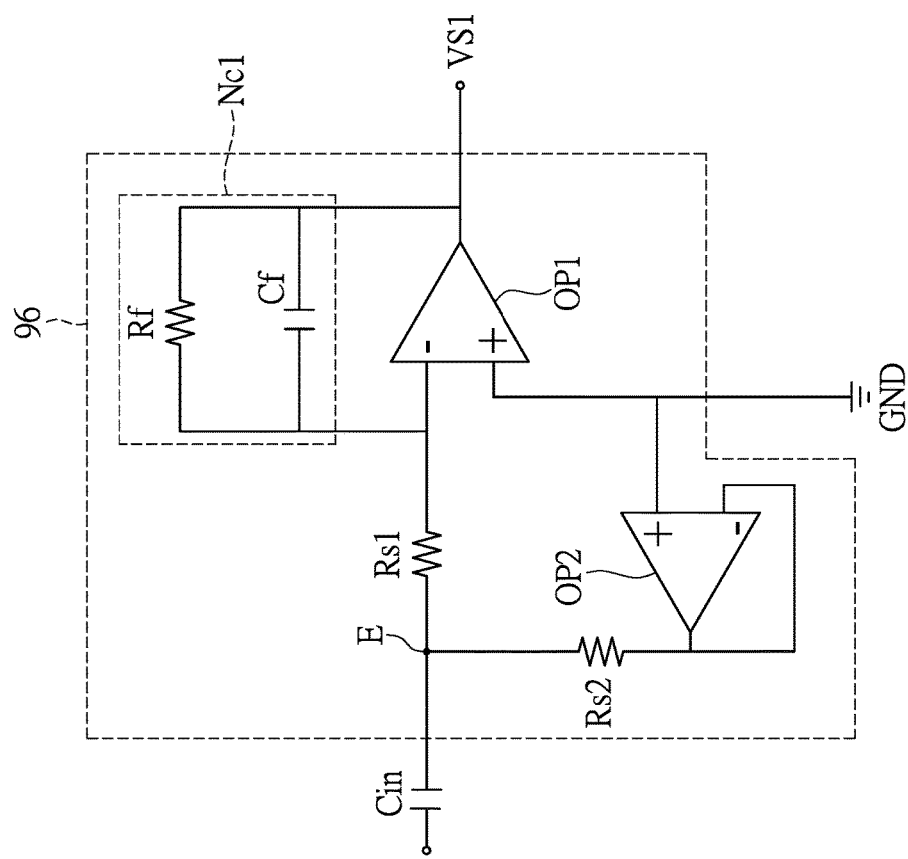
FIG. 14 shows a circuit diagram of a capacitance-to-voltage converter of still another embodiment of the instant disclosure.

Finally, referring to FIG. 14, FIG. 14 shows a circuit diagram of a capacitance-to-voltage converter of still another embodiment of the instant disclosure. For easy instruction, similar reference numbers or symbols refer to like elements in FIG. 14 and FIGS. 12 and 13.

As shown in FIG. 14, the capacitance-to-voltage converter 96 comprises an operation amplifier OP1 and an operation amplifier OP2, a negative feedback circuit Nc1, a resistor Rs1 and another resistor Rs2. The inverting input end of the operation amplifier OP1 is connected to an input capacitor Cin, the non-inverting input end of the operation amplifier OP1 is connected to a grounding voltage GND, and the output end of the operation amplifier OP1 outputs an analog voltage signal Vs1 according to the capacitance of the input capacitor Cin. In addition, the negative feedback circuit Nc1 is connected between the inverting input end and the output end of the operation amplifier OP1, and the negative feedback circuit Nc1 is composed of a capacitor Cf and a resistor Rf connected in parallel. The resistor Rs1 is connected between the inverting input end of the operation amplifier OP1 and the input capacitor Cin.

Moreover, the non-inverting input end of the operation amplifier OP2 is connected to a grounding voltage GND, and the inverting input end and the output end of the operation amplifier OP2 are connected. The first end of the resistor Rs2 is connected to a node E between the input capacitor Cin and the resistor Rs1, and the second end of the resistor Rs2 is connected to the output end of the operation amplifier OP2. Those skilled in the art should be familiar with the working principle of the capacitance-to-voltage converter 96, and thus details relevant to the capacitance-to-voltage converter 96 are omitted herein.

To sum up, the capacitive pressure sensing circuit and the capacitance-to-voltage converter thereof have no complex circuits. Instead, the circuit configuration of the pressure sensing circuit and the capacitance-to-voltage converter thereof is quite simple. By using the pressure sensing circuit and the capacitance-to-voltage converter provided by the instant disclosure, the inductive capacitance generated by the capacitive pressure sensor can be attenuated. Thereby, the capacitance-to-voltage converter will not receive a too large inductive capacitance and thus an overflow can be avoided, and also the capacitance-to-voltage converter can effectively output an analog voltage signal corresponding to the attenuated inductive capacitance.

The descriptions illustrated supra set forth simply the preferred embodiments of the instant disclosure; however, the characteristics of the instant disclosure are by no means restricted thereto. All changes, alterations, or modifications conveniently considered by those skilled in the art are deemed to be encompassed within the scope of the instant disclosure delineated by the following claims.

What is claimed is:

1. A capacitive pressure sensing circuit, comprising:
    a converter, connected to a pin, receiving a sensing signal provided by the pin, and thereby outputting an analog voltage signal;
    a cancellation circuit, connected between the converter and the pin, generating a cancellation signal, such that the converter outputs the analog voltage signal according to the sensing signal and the cancellation signal;
    an analog-to-digital converter, connected to the converter and converting the analog voltage signal to a digital voltage signal; and
    a digital signal processor, connected to the analog-to-digital converter and generating a sensed pressure related to the sensing signal according to the digital voltage signal.

2. The pressure sensing circuit according to claim 1, wherein an inductive capacitance generated by at least one capacitive pressure sensor is represented by the sensing signal, and the pin is configured to make the pressure sensing circuit connect to an output end of the capacitive pressure sensor.

3. The pressure sensing circuit according to claim 2, wherein the converter is a capacitance-to-voltage converter and the capacitance-to-voltage converter comprises:
    an operation amplifier, having an inverting input end connected to a node between the pin and the cancellation circuit, having a non-inverting input end connected to a grounding voltage, and having an output end connected to the analog-to-digital converter; and
    a negative feedback circuit, connected between the inverting input end and the output end of the operation amplifier, wherein the negative feedback circuit is composed of a capacitor and a first switch connected in parallel, and the turning on and off of the first switch is controlled by a first control signal.

4. The pressure sensing circuit according to claim 3, wherein the pressure sensing circuit comprises:
a second switch, connected between the pin and the node, wherein the turning on and off of the second switch is controlled by a second control signal; and
a third switch, connected between the pin and the grounding voltage, wherein the turning on and off of the third switch is controlled by the first control signal;
wherein the first switch and the third switch are turned on by the first control signal at the same time point, but the time point when the first switch and the third switch are turned on by the first control signal and the time point when the second switch is turned on by the second control signal are different.

5. The pressure sensing circuit according to claim 4, wherein the cancellation circuit is a branch circuit, wherein the branch circuit is connected between the node and the grounding voltage and configured to decrease the inductive capacitance generated by the capacitive pressure sensor, such that the capacitance-to-voltage converter outputs the analog voltage signal according to the decreased inductive capacitance.

6. The pressure sensing circuit according to claim 5, wherein the branch circuit comprises:
a constant current circuit, wherein when the second switch is turned on by the second control signal, the constant current circuit attenuates the inductive capacitance generated by the capacitive pressure sensor according to a predetermined parameter, such that capacitance-to-voltage converter outputs the analog voltage signal according to the attenuated inductive capacitance.

7. The pressure sensing circuit according to claim 2, wherein the cancellation circuit comprises:
a signal generator, generating the cancellation signal wherein the cancellation signal generated by the signal generator and the inductive capacitance generated by the capacitive pressure sensor have opposite polarities; and
an addition circuit, after adding the cancellation signal to the inductive capacitance generated by the capacitive pressure sensor, providing the inductive capacitance to the converter.

8. The pressure sensing circuit according to claim 7, wherein the converter is a capacitance-to-voltage converter and the capacitance-to-voltage converter comprises:
an operation amplifier, having an inverting input end connected to the pin through the addition circuit, having a non-inverting input end connected to a reference voltage, and having an output end connected to the analog-to-digital converter; and
a negative feedback circuit, connected between the inverting input end and the output end of the operation amplifier, wherein the negative feedback circuit is composed of a capacitor and a resistor connected in parallel.

9. A capacitive pressure sensing circuit, comprising:
a converter, connected to a pin, receiving a sensing signal provided by the pin, and thereby outputting an analog voltage signal;
an analog-to-digital converter, connected to the converter, and converting the analog voltage signal to a digital voltage signal;
a cancellation circuit, connected between the converter and the analog-to-digital converter, and generating a cancellation signal, such that the analog-to-digital converter outputs the digital voltage signal according to the analog voltage signal with the cancellation signal subtracted; and
a digital signal processor, connected to the analog-to-digital converter, and generating a sensed pressure related to the sensing signal according to the digital voltage signal.

10. The pressure sensing circuit according to claim 9, wherein an inductive capacitance generated by at least one capacitive pressure sensor is represented by the sensing signal, and the pin is configured to make the pressure sensing circuit connect to an output end of the capacitive pressure sensor.

11. The pressure sensing circuit according to claim 10, wherein the converter is a capacitance-to-voltage converter and the capacitance-to-voltage converter comprises:
a first operation amplifier, having an inverting input end connected to the pin, having a non-inverting input end connected to a grounding voltage, and having an output end connected to the analog-to-digital converter; and
a first negative feedback circuit, connected between the inverting input end and the output end of the first operation amplifier, wherein the first negative feedback circuit is composed of a first capacitor and a first resistor connected in parallel.

12. The pressure sensing circuit according to claim 11, wherein the cancellation circuit comprises:
a subtraction circuit, connected between the output end of the first operation amplifier and the analog-to-digital converter;
a second operation amplifier, having an inverting input end connected to an input end of the capacitive pressure sensor, having a non-inverting input end connected to the grounding voltage, and having an output end connected to the subtraction circuit;
a second negative feedback circuit, connected between the inverting input end and the output end of the second operation amplifier, wherein the second negative feedback circuit is composed of a second capacitance and a second resistor connected in parallel; and
a reference capacitor, connected between the inverting input end of the second operation amplifier and the input end of the capacitive pressure sensor.

13. The pressure sensing circuit according to claim 12, wherein the second operation amplifier, the second negative feedback circuit, the reference capacitor and the capacitance-to-voltage converter are all configured on the same substrate, and when a driving signal is inputted to the input end of the capacitive pressure sensor, the second operation amplifier starts to output a reference voltage signal according to the reference capacitor, and the subtraction circuit is configured to execute a subtraction operation for the analog voltage signal outputted by the capacitance-to-voltage converter and the reference voltage signal generated by the second operation amplifier, and then to provide an operation result to the analog-to-digital converter.

14. The pressure sensing circuit according to claim 10, wherein the converter is a capacitance-to-voltage converter and the capacitance-to-voltage converter comprises:
an operation amplifier, having an inverting input end connected to the pin, having a non-inverting input end connected to an input end of the capacitive pressure sensor, and having an output end connected to the analog-to-digital converter; and a negative feedback circuit, connected between the inverting input end and the output end of the operation amplifier, wherein the negative feedback circuit is composed of a first capacitor and a first resistor connected in parallel.

15. The pressure sensing circuit according to claim 14, wherein the cancellation circuit comprises:
a positive feedback circuit, connected between the non-inverting input end and the output end of the operation amplifier, wherein the negative feedback circuit is composed of a second capacitor and a second resistor connected in parallel; and
a reference capacitor, connected between the inverting input end of the operation amplifier and the input end of the capacitive pressure sensor.

16. The pressure sensing circuit according to claim 10, wherein the converter is a capacitance-to-voltage converter, the cancellation circuit is integrated into the capacitance-to-voltage converter, and the capacitance-to-voltage converter comprises:
an operation amplifier, having an inverting input end connected to a pin, having a non-inverting input end connected to a signal generator, and having an output end connected to the analog-to-digital converter;
a negative feedback circuit, connected between the inverting input end and the output end of the operation amplifier, wherein the negative feedback circuit is composed of a first capacitor and a first resistor connected in parallel; and
a positive feedback circuit, connected between the non-inverting input end and the output end of the operation amplifier, wherein the negative feedback circuit is composed a second capacitor and a second resistor connected in parallel.

17. A capacitive pressure sensing circuit, comprising:
a converter, connected to a pin, receiving a sensing signal provided by the pin and thereby outputting an analog voltage signal;
a suppression circuit, connected between the converter and the pin, suppressing the sensing signal according to a predetermined parameter and providing the suppressed sensing signal to the converter, such that the converter outputs the analog voltage signal according to the suppressed sensing signal;
an analog-to-digital converter, connected to the converter and converting the analog voltage signal to a digital voltage signal; and
a digital signal processor, connected to the analog-to-digital converter and generating a sensed pressure related to the sensing signal according to the digital voltage signal.

18. The pressure sensing circuit according to claim 17, wherein an inductive capacitance generated by at least one capacitive pressure sensor is represented by the sensing signal, and the pin is configured to make the pressure sensing circuit connect to an output end of the capacitive pressure sensor.

19. The pressure sensing circuit according to claim 18, wherein the converter is a capacitance-to-voltage converter and the capacitance-to-voltage converter comprises:
a first operation amplifier, having an inverting input end connected to the pin through the suppression circuit, having a non-inverting input end connected to a reference voltage, and having an output end connected to the analog-to-digital converter; and
a negative feedback circuit, connected between the inverting input end and the output end of the first operation amplifier, wherein the negative feedback circuit is composed of a capacitor and a first resistor connected in parallel.

20. The pressure sensing circuit according to claim 19, wherein the suppression circuit is an impedance component connected between the inverting input end of the first operation amplifier and the pin, wherein the predetermined parameter is determined by the impedance of the impedance component, and the impedance component is configured to suppress the inductive capacitance generated by the capacitive pressure sensor, such that capacitance-to-voltage converter outputs the analog voltage signal according to the suppressed inductive capacitance.

21. The pressure sensing circuit according to claim 20, wherein the impedance component at least has a passive component.

22. The pressure sensing circuit according to claim 19, wherein the suppression circuit is a voltage divider and the voltage divider comprises a second resistor and a third resistor, wherein the second resistor is connected between the inverting input end of the first operation amplifier and the pin, a first end of the third resistor is connected to a node between the second resistor and the pin, and a second end of the third resistor is connected to the reference voltage.

23. The pressure sensing circuit according to claim 19, wherein when the reference voltage is a grounding voltage, the suppression circuit comprises:
a second resistor, connected between the inverting input end of the first operation amplifier and the pin;
a second operation amplifier, having a non-inverting input end connected to the grounding voltage and having an inverting input end connected to an output end of the second operation amplifier; and
a third resistor, having a first end connected to a node between the pin and the second resistor and having a second end connected to the output end of the second operation amplifier.

24. A capacitance-to-voltage converter, used to prevent an overflow happening when the capacitance of an input capacitor is too large, comprising:
an operation amplifier, having an inverting input end connected to the input capacitor, having a non-inverting input end connected to a reference voltage and having an output end to output an analog voltage signal according to the input capacitor;
a negative feedback circuit, connected between the inverting input end and the output end of the operation amplifier, wherein the negative feedback circuit is composed of a capacitor and a resistor connected in parallel; and
an impedance component, connected between the inverting input end of the operation amplifier and the input capacitor, wherein the impedance component suppresses the capacitance of the input capacitor according to a predetermined parameter, such that the output end of the operation amplifier outputs the analog voltage signal according to the suppressed capacitance of the input capacitor.

25. The capacitance-to-voltage converter according to claim 24, wherein the impedance component has at least one passive element.

26. A capacitance-to-voltage converter, used to prevent an overflow happening when the capacitance of an input capacitor is too large, comprising:
an operation amplifier, having an inverting input end connected to the input capacitor, having a non-inverting input end connected to a reference voltage and having an output end outputting an analog voltage signal according to the capacitance of the input capacitor;

a negative feedback circuit, connected between the inverting input end and the output end of the operation amplifier, wherein the negative feedback circuit is composed of a capacitor and a first resistor connected in parallel;

a second resistor, connected between the inverting input end of the operation amplifier and the input capacitor; and a third resistor, having a first end connected to a node between the second resistor and the input capacitor and having a second end connected to the reference voltage.

27. A capacitance-to-voltage converter, used to prevent an overflow happening when the capacitance of an input capacitor is too large, comprising:

a first operation amplifier, having an inverting input end connected to the input capacitor, having a non-inverting input end connected to a grounding voltage and having an output end to output an analog voltage signal according to the capacitance of the input capacitor;

a negative feedback circuit, connected between the inverting input end and the output end of the first operation amplifier, wherein the negative feedback circuit is composed of a capacitor and a first resistor connected in parallel;

a second resistor, connected between the inverting input end of the first operation amplifier and the input capacitor;

a second operation amplifier, having a non-inverting input end connected to the grounding voltage, having an inverting input end connected to an output end of the second operation amplifier; and a third resistor, having a first end connected to a node between the input capacitor and the second resistor, and having a second end connected to the output end of the second operation amplifier.

28. A capacitive pressure sensing circuit, comprising:

a converter, connected to a pin, receiving a capacitance sensing signal provided by the pin and thereby outputting a circuit signal related to a pressure sensed by the capacitance sensing signal; and a cancellation circuit, connected between the converter and the pin and generating a cancellation signal, such that the converter outputs the circuit signal according to the capacitance sensing signal and the cancellation signal.

29. The pressure sensing circuit according to claim 28, wherein the circuit signal is a voltage signal, and the voltage of the voltage signal is positively proportional to the pressure sensed by the capacitance sensing signal.

30. The pressure sensing circuit according to claim 29, wherein the voltage signal is an analog voltage signal and the converter is further connected to an analog-to-digital converter, wherein the analog-to-digital converter is configured to convert the analog voltage signal to a digital voltage signal.

31. The pressure sensing circuit according to claim 30, further comprising:

a digital signal processor, connected to the analog-to-digital converter, and generating a sensed pressure related to the capacitance sensing signal according to the digital voltage signal.

* * * * *